US012777818B2

(12) United States Patent
Kim et al.

(10) Patent No.: US 12,777,818 B2
(45) Date of Patent: Oct. 27, 2026

(54) ELECTRONIC DEVICE WITH LIGHT TRANSMITTANCE FILLING PART AND METHOD FOR MANUFACTURING THE SAME

(71) Applicant: SAMSUNG DISPLAY CO., LTD., Yongin-si (KR)

(72) Inventors: Youngji Kim, Yongin-si (KR); Dongjo Kim, Yongin-si (KR); Seonggeun Won, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 573 days.

(21) Appl. No.: 18/355,197

(22) Filed: Jul. 19, 2023

(65) Prior Publication Data

US 2024/0138236 A1 Apr. 25, 2024
US 2024/0237489 A9 Jul. 11, 2024

(30) Foreign Application Priority Data

Oct. 20, 2022 (KR) ........................ 10-2022-0135955

(51) Int. Cl.
*H10K 59/80* (2023.01)
*H04M 1/02* (2006.01)
(Continued)

(52) U.S. Cl.
CPC ........ *H10K 59/873* (2023.02); *H04M 1/0264* (2013.01); *H10K 59/1201* (2023.02);
(Continued)

(58) Field of Classification Search
CPC ............. H10K 59/873; H10K 59/1201; H10K 59/1213; H10K 59/65; H10K 59/123; H10K 59/8792; H10K 71/00; H04M 1/0264
(Continued)

(56) References Cited

U.S. PATENT DOCUMENTS 10,991,774 B2 4/2021 Sung et al.
11,171,192 B2 11/2021 Jeon et al.
(Continued)

FOREIGN PATENT DOCUMENTS

KR 10-2019-0098703 8/2019
KR 10-2020-0014462 A 2/2020
(Continued)

*Primary Examiner* — Eric W Jones
(74) *Attorney, Agent, or Firm* — F. CHAU & ASSOCIATES, LLC

(57) ABSTRACT

An electronic device includes a display device and an electronic device. The display device includes a base layer, a circuit element layer, a display element layer, an encapsulation layer, a cover inorganic layer, a cover organic layer, an anti-reflection layer, and a filling part configured to overlap the first area. The electronic device is disposed below the base layer and configured to overlap the first area. A module hole is defined in the display module through which the circuit element layer, the display element layer, the encapsulation layer, the cover inorganic layer, and the cover organic layer overlapping the first area passes through
(Continued)

to expose the base layer, and the filling part is disposed inside the module hole and is in contact with a portion of the base layer exposed by the module hole.

19 Claims, 14 Drawing Sheets

(51) Int. Cl.

| | |
|---|---|
| ***H10K 59/12*** | (2023.01) |
| ***H10K 59/121*** | (2023.01) |
| ***H10K 59/123*** | (2023.01) |
| ***H10K 59/65*** | (2023.01) |
| ***H10K 71/00*** | (2023.01) |

(52) U.S. Cl.
CPC ....... *H10K 59/1213* (2023.02); *H10K 59/123* (2023.02); *H10K 59/65* (2023.02); *H10K 59/8792* (2023.02); *H10K 71/00* (2023.02)

(58) Field of Classification Search
USPC .......................... 257/40, 59, 88, 91, 99, 100
See application file for complete search history.

(56) References Cited

U.S. PATENT DOCUMENTS

| | | | | |
|---|---|---|---|---|
| 11,258,040 | B2 | 2/2022 | Won | |
| 11,380,875 | B2 | 7/2022 | Park et al. | |
| 11,937,454 | B2 | 3/2024 | Seo et al. | |
| 12,058,885 | B2 | 8/2024 | Yim | |
| 2019/0293849 | A1* | 9/2019 | Du | G02B 5/223 |
| 2020/0235180 | A1* | 7/2020 | Park | H10K 59/8731 |
| 2020/0295300 | A1* | 9/2020 | Chung | H10K 59/124 |
| 2020/0303677 | A1* | 9/2020 | Lee | H10K 77/10 |
| 2021/0057490 | A1* | 2/2021 | Choi | G06F 3/04164 |
| 2021/0066410 | A1* | 3/2021 | Jo | H10K 59/40 |
| 2021/0157449 | A1* | 5/2021 | Lee | G06F 3/0412 |
| 2021/0226174 | A1* | 7/2021 | Kim | H04N 23/57 |
| 2021/0249488 | A1* | 8/2021 | Sung | H04N 23/55 |

FOREIGN PATENT DOCUMENTS

| | | | |
|---|---|---|---|
| KR | 10-2020-0118266 | | 10/2020 |
| KR | 10-2020-0120845 | | 10/2020 |
| KR | 10-2021-0027715 | A | 3/2021 |
| KR | 10-2022-0091648 | A | 7/2022 |

* cited by examiner

ELECTRONIC DEVICE WITH LIGHT TRANSMITTANCE FILLING PART AND METHOD FOR MANUFACTURING THE SAME

CROSS-REFERENCE TO RELATED APPLICATIONS

This U.S. non-provisional patent application claims priority under 35 U.S.C. § 119 to Korean Patent Application No. 10-2022-0135955, filed on Oct. 20, 2022, the disclosure of which is incorporated by reference herein.

1. TECHNICAL FIELD

The present disclosure herein relates to an electronic device and a method for manufacturing the same.

2. DISCUSSION OF RELATED ART

Multimedia electronic devices, such as a television (TV), a cellular phone, a tablet computer, a navigation system, and a game console, include a display device that displays an image. Display devices may include an input sensor that provides a touch-based input for enabling a user to input information or a command.

The display device of the electronic device may include a hole and a sensor such as a camera may be disposed within the hole. However, the structural integrity of the electronic device may become compromised due to the hole. Further, a waviness of the display device may be caused due to interference with reflected light introduced into the hole. Moreover, components of the electronic device may become damaged if moisture or oxygen enters the hole. Thus, the reliability of the electronic device and the quality of a display device of the electronic device may become reduced.

SUMMARY

At least one embodiment of the present disclosure provides an electronic device having increased reliability having a display device having increased quality and a method for manufacturing the same.

An embodiment of the inventive concept provides an electronic device including: a display device and a sensor. The display device includes: a base layer including a first area and a second area that has light transmittance less than that of the first area and surrounds at least a portion of the first area; a circuit element layer including insulating layers and a transistor and disposed on the base layer, a display element layer including a light emitting element connected to the transistor and disposed on the circuit element layer, an encapsulation layer configured to cover the display element layer, a cover inorganic layer disposed on the encapsulation layer; a cover organic layer disposed on the cover inorganic layer; an anti-reflection layer disposed on the cover organic layer and including a hole opening configured to overlap the first area; and a filling part configured to overlap the first area. The sensor is disposed below the base layer and configured to overlap the first area. A module hole is defined in the display device through which the circuit element layer, the display element layer, the encapsulation layer, the cover inorganic layer, and the cover organic layer overlapping the first area passes through to expose the base layer. The filling part is disposed inside the module hole and is in contact with a portion of the base layer exposed by the module hole.

In an embodiment, the electronic device may further include a first adhesive layer disposed between the cover organic layer and the anti-reflection layer and including a first opening corresponding to the hole opening, wherein the filling part may be in contact with a side surface of the anti-reflection layer defining the hole opening, and a side surface of the first adhesive layer defining the first opening.

In an embodiment, a width of the hole opening in one direction may be greater than a width of the first opening in the one direction, and a top surface of the first adhesive layer exposed from the anti-reflection layer by the hole opening, may be in contact with the filling part.

In an embodiment, a width of each of the hole opening and the first opening in one direction may be greater than a width of the module hole in the one direction, and a top surface of the cover organic layer exposed from the anti-reflection layer and the first adhesive layer by the hole opening and the first opening, may be in contact with the filling part.

In an embodiment, the electronic device may further include a second adhesive layer disposed on the anti-reflection layer and a window disposed on the second adhesive layer.

In an embodiment, the filling part may be in contact with a rear surface of the second adhesive layer.

In an embodiment, the second adhesive layer may include a second opening corresponding to the hole opening, and the filling part may be in contact with a side surface of the second adhesive layer defining the second opening.

In an embodiment, the filling part may be in contact with a rear surface of the window exposed from the second adhesive layer by the second opening.

In an embodiment, the filling part may include a polymer resin.

In an embodiment, the first area may include a hole area corresponding to the module hole and a blocking area configured to surround the hole area and adjacent to the second area, and the circuit element layer may include a dam part that overlaps the blocking area, may include a same material as at least one of the insulating layers, and surrounds the hole area.

In an embodiment, a lower insulating layer and an upper insulating layer in contact with the lower insulating layer, among the insulating layers inside the blocking area may include a tip opening, and the circuit element layer may further include a protruding pattern having a first side protruding between a side surface of the lower insulating layer and a side surface of the upper insulating layer defining the tip opening, and a second other side disposed between the lower insulating layer and the upper insulating layer.

In an embodiment, the electronic device may further include a lower pattern connected to the protruding pattern through a contact hole defined in the lower insulating layer and disposed between the lower insulating layer and the base layer.

In an embodiment, at least one of the protruding pattern and the lower pattern may be disposed on a same layer as one of a plurality of electrodes in the transistor.

In an embodiment, the encapsulation layer may include a first inorganic layer that is in contact with the display element layer, a second inorganic layer disposed on the first inorganic layer, and an organic layer disposed between the first inorganic layer and the second inorganic layer, wherein the first inorganic layer may be in contact with the side surface of the lower insulating layer, the side surface of the upper insulating layer, and the first side of the protruding pattern, which define the tip opening.

In an embodiment, the light emitting element may include a first electrode connected to the transistor, a second electrode disposed on the first electrode, and an emission layer disposed between the first electrode and the second electrode, and the circuit element layer may further include a tip pattern disposed inside the tip opening, wherein the tip pattern may include a same material as the second electrode.

In an embodiment, the sensor includes a camera.

In an embodiment, the base layer may include glass.

In an embodiment of the inventive concept, a method for manufacturing an electronic device, the method including: forming a preliminary display panel including a base layer including an active area, on which a hole processing area is defined, and a circuit element layer, a display element layer, an encapsulation layer, a cover inorganic layer, and a cover organic layer, which are sequentially laminated on the base layer; removing a portion of the circuit element layer, the display element layer, the encapsulation layer, the cover inorganic layer, and the cover organic layer, which overlap the hole processing area, to form a module hole; forming a first adhesive layer including a first opening corresponding to the module hole on the cover organic layer; forming an anti-reflection layer including a hole opening corresponding to the first opening on the first adhesive layer; and filling the module hole with a filling part, wherein the module hole exposes the base layer overlapping the hole processing area.

In an embodiment, the filling part may be in contact with a side surface of the anti-reflection layer defining the hole opening, and a side surface of the first adhesive layer defining the first opening.

In an embodiment, a width of each of the hole opening and the first opening in one direction may be greater than a width of the module hole in the one direction, and a top surface of the cover organic layer exposed from the anti-reflection layer and the first adhesive layer by the hole opening and the first opening, may be in contact with the filling part.

In an embodiment, the method may further include: forming a second adhesive layer on the anti-reflection layer, and forming a window on the second adhesive layer.

In an embodiment, the forming of the module hole may include removing the portion of the circuit element layer, the display element layer, the encapsulation layer, the cover inorganic layer, and the cover organic layer, which overlap the hole processing area, by applying a laser beam to the portion.

In an embodiment, the method may further include forming an sensor below the base layer overlapping the module hole.

In an embodiment, the filling part may include a polymer resin.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

In this specification, it will also be understood that when one component (or area, layer, portion) is referred to as being 'on', 'connected to', or 'coupled to' another component, it can be directly disposed/connected/coupled on/to the one component, or an intervening third component may also be present.

The term "and/or" may include any and all combinations of one or more of the associated elements.

It will be understood that although the terms such as 'first' and 'second' are used herein to describe various elements, these elements should not be limited by these terms. These terms are used only to distinguish one component from other components. For example, a first element referred to as a first element in an embodiment can be referred to as a second element in another embodiment without departing from the scope of the appended claims. The terms of a singular form may include plural forms unless referred to the contrary.

Hereinafter, embodiments of the inventive concept will be described with reference to the accompanying drawings.

Figure 1:
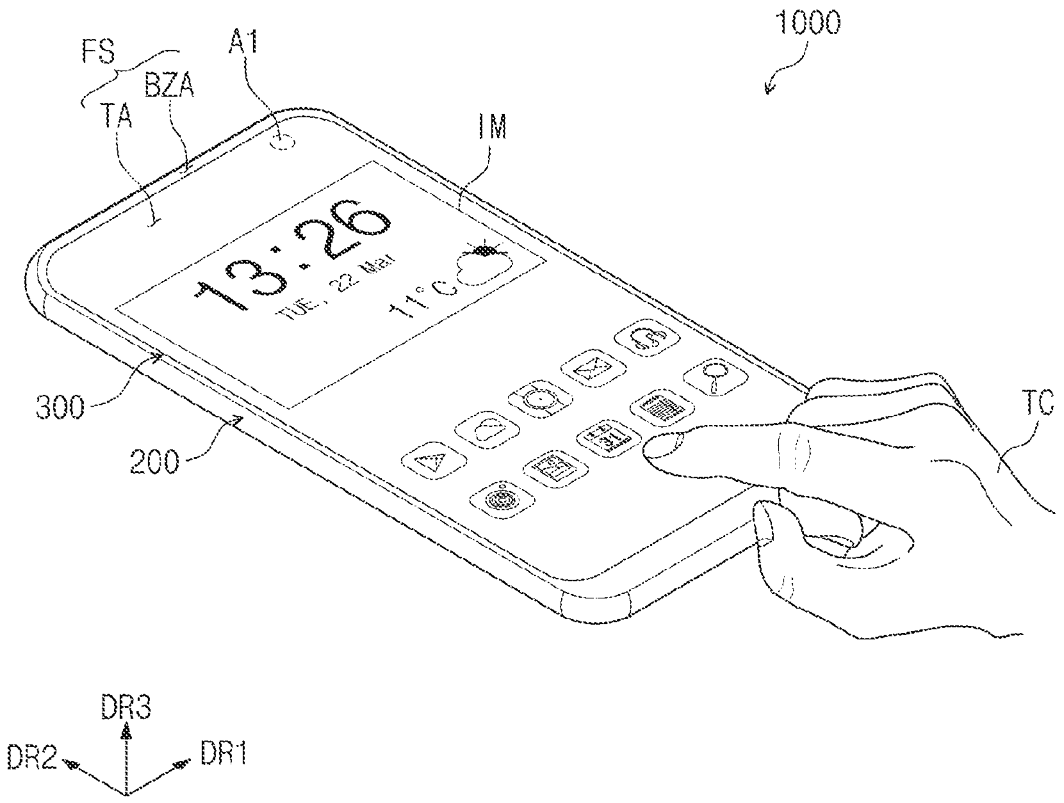
FIG. 1 is a perspective view of an electronic device according to an embodiment of the inventive concept.
Figure 2:
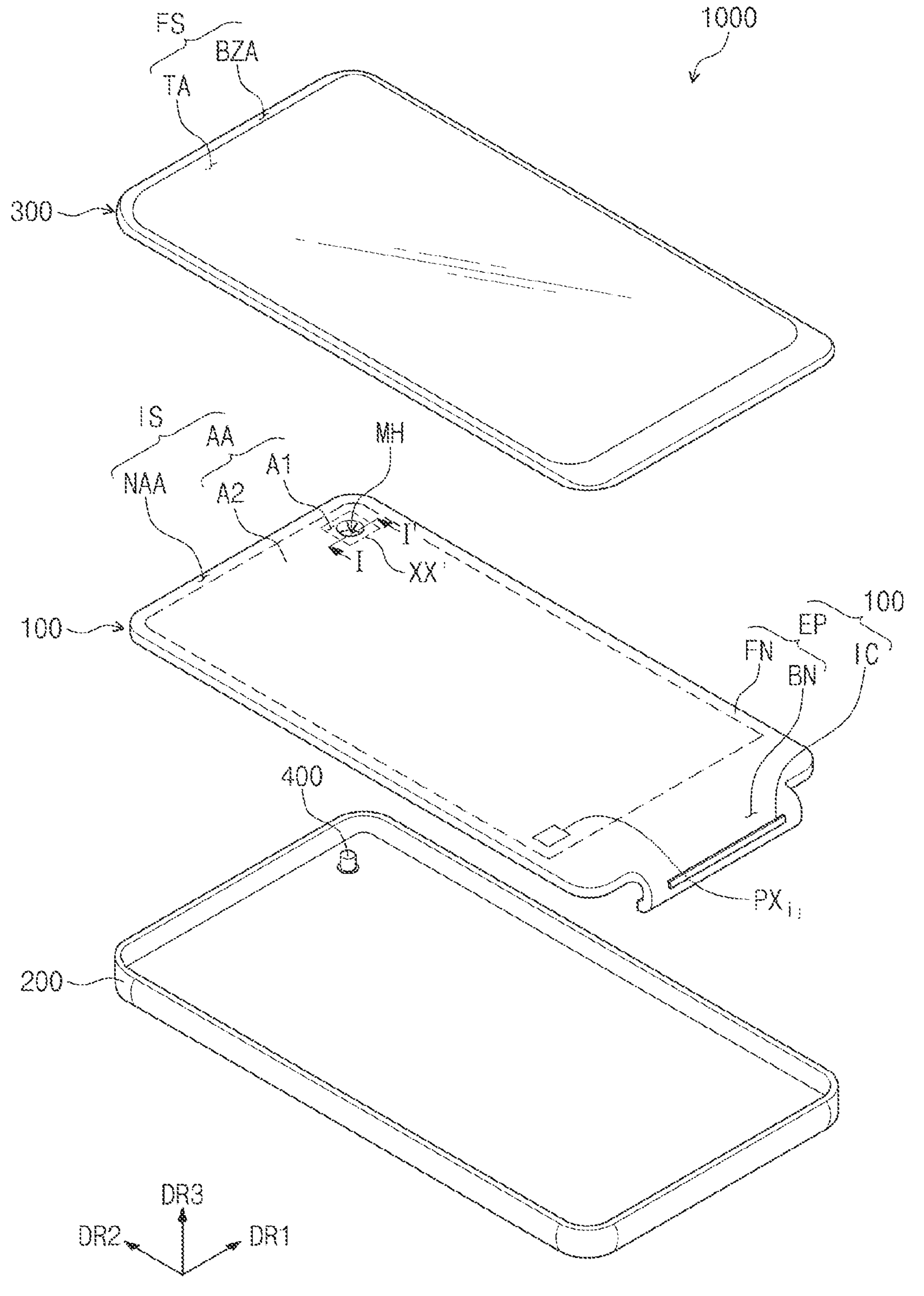
FIG. 2 is an exploded perspective view of the electronic device according to an embodiment of the inventive concept.
Figure 3:
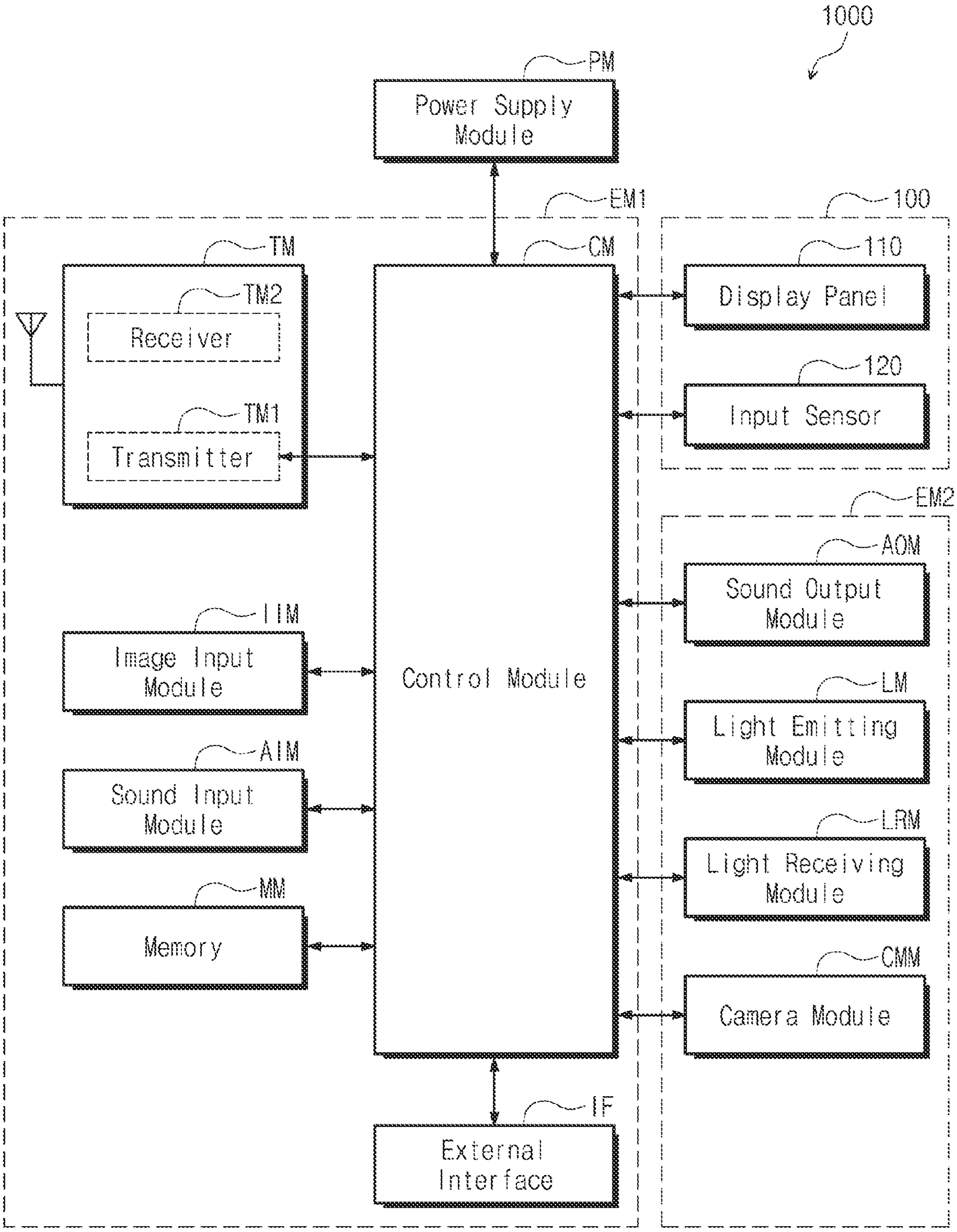
FIG. 3 is a block diagram of the electronic device according to an embodiment of the inventive concept.
Figure 4:
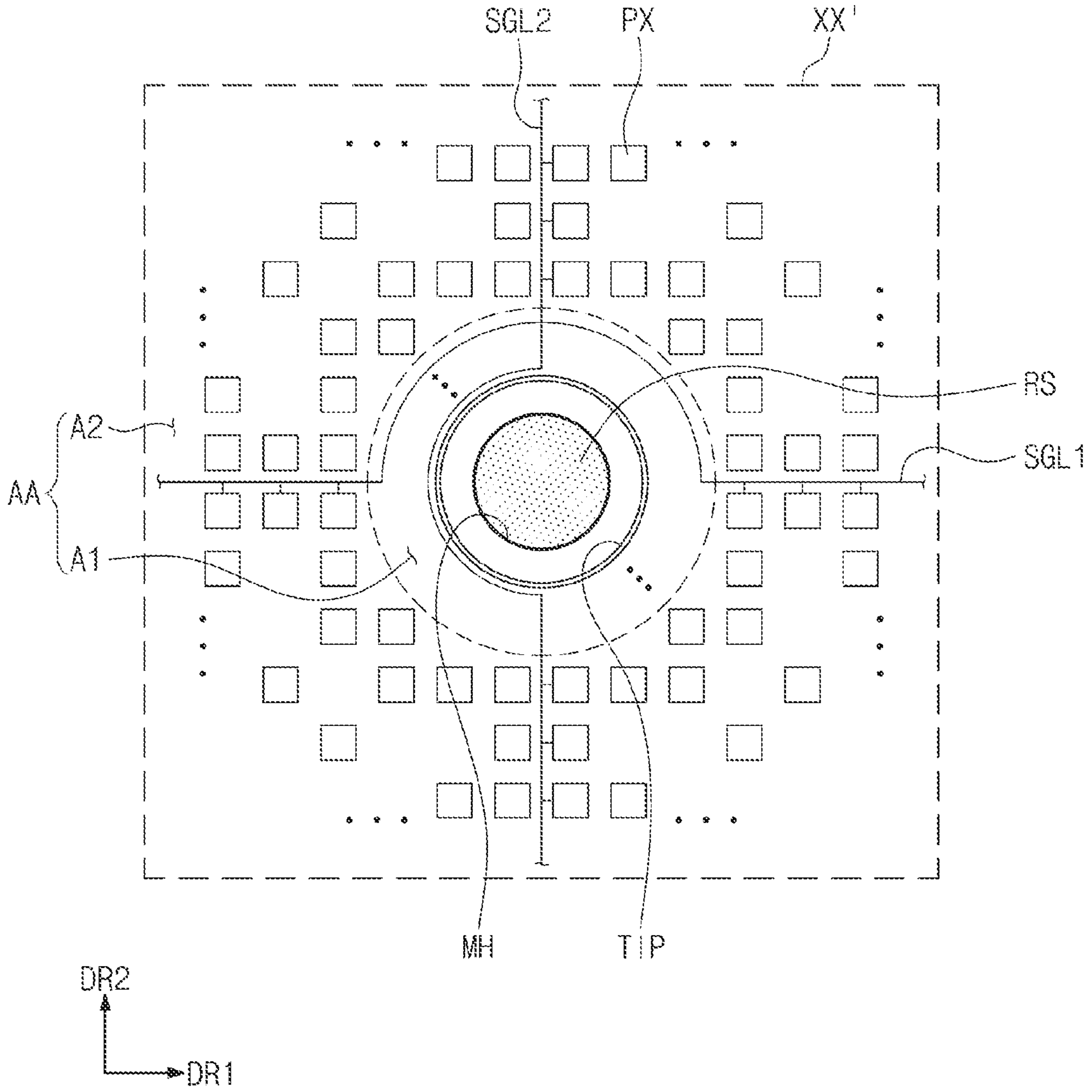
FIG. 4 is a plan view of a display panel adjacent to a hole according to an embodiment of the inventive concept.

FIG. 1 is a perspective view of an electronic device according to an embodiment of the inventive concept. FIG. 2 is an exploded perspective view of an electronic device according to an embodiment of the inventive concept. FIG. 3 is a block diagram of the electronic device according to an embodiment of the inventive concept. FIG. 4 is a plan view of a display panel adjacent to a hole according to an embodiment of the inventive concept.

An electronic device 1000 according to an embodiment may be a device that is activated according to an electrical signal. The electronic device 1000 may include various embodiments. For example, the electronic device 1000 may include a tablet, a notebook, a computer, a smart television, and the like. In this embodiment, a smart phone will be described as an example of the electronic device 1000.

As illustrated in FIG. 1, the electronic device 1000 may display an image IM in a third direction DR3 on a display surface FS that is parallel to each of first and second directions DR1 and DR2. The display surface FS on which the image IM is displayed may correspond to a front surface of the display device 1000 and also correspond to a front surface FS of a window 300. Thus, the display surface FS of the electronic device 1000 and the front surface FS of the window 300 may use the same reference numerals. The image IM may include a still image as well as a dynamic image. In FIG. 1, the image IM is illustrated as a watch and a plurality of icons as an example.

In this embodiment, a front surface (or a top surface) or a rear surface (or a bottom surface) of each of members may be defined based on a direction in which the image IM is displayed. The front and rear surfaces may be opposite to each other in the third direction DR3. A normal direction of each of the front and rear surfaces may be parallel to the third direction DR3. A spaced distance between the front and rear surfaces in the third direction DR3 may correspond to a thickness of the electronic device 1000 in the third direction DR3.

The electronic device 1000 according to an embodiment of the inventive concept may sense a user's input TC applied from the outside. The user's input TC includes various types of external inputs such as a portion of user's body, light, heat, a pressure, or the like. In this embodiment, the user's input TC is illustrated as a user's hand applied to the front surface FS of the window 300.

However, this is merely an example. For example, as described above, the user's input TC may be provided in various shapes. The electronic device 1000 may sense the user's input TC applied to a side surface or the rear surface of the electronic device 1000 according to a structure of the electronic device 1000, but is not limited to a specific embodiment.

The electronic device 1000 according to an embodiment may include a first area A1 defined inside a light transmission area TA. The first area A1 may be an area overlapping an electronic module 400 of a display module 100 described later. A module hole MH (or an opening) of the display module 100 may be defined in the first area A1.

The electronic device 1000 may receive an external signal required for the electronic module 400 through the first area A1 or may provide a signal output from the electronic module 400 to the outside. For example, if the electronic module 400 is a camera, light may pass through the module hole MH to enable the camera to capture an image or video. According to an embodiment of the inventive concept, since the first area A1 may be provided inside the light transmission area TA, a surface area of a bezel area BZA that defines the first area A1 may be reduced.

Referring to FIG. 2, the electronic device 1000 may include a display module 100, a housing 200, a window 300, and an electronic module 400. The window 300 and the housing 200 may be coupled to each other to define an outer appearance of the electronic device 1000.

The window 300 may include an insulation panel. For example, the window 300 may be made of glass, plastic, or a combination thereof. As described above, the front surface FS of the window 300 defines the front surface FS of the electronic device 1000. The window 300 may include the light transmission area TA and the bezel area BZA adjacent to the light transmission area TA. The light transmission area TA may be an optically transparent area. For example, the light transmission area TA may be an area having a visible light transmittance of about 90% or more. The bezel area BZA may be an area having light transmittance that is relatively less than that of the light transmission area TA. The bezel area BZA defines a shape of the light transmission area TA.

The bezel area BZA may have a predetermined color. The bezel area BZA may be defined by a bezel layer provided separately from a transparent substrate defining the light transmission area TA, or by an ink layer inserted into or colored on the transparent substrate.

The display module 100 may include an electronic panel EP and a driving circuit IC. The electronic panel EP may display the image IM and sense the user's input TC. A front surface IS of the electronic panel EP includes an active area AA and a peripheral area NAA. The active area AA may be an area that is activated according to an electrical signal.

In this embodiment, the active region AA may have an area on which the image IM is displayed, and also, the external input TC is sensed. The active area AA may be an area on which a plurality of pixels PXij are disposed.

The active area AA overlaps at least a portion of the light transmission area TA. For example, the light transmission area TA overlaps the front surface or at least a portion of the active area AA. Thus, the user may visually recognize the image IM through the light transmission area TA or provide the external input TC. However, this is merely an example. For example, an area of the active region AA, on which the image IM is displayed, and an area of the active region AA, on which the external input TC is sensed, may be separated from each other, but is not limited to a specific embodiment.

The peripheral region NAA may be an area covered by the bezel area BZA. The peripheral area NAA is adjacent to the active area AA. The peripheral region NAA may surround the active region AA. The peripheral area NAA may be an area on which the image IM is not displayed. A driving circuit or a driving line for driving the active area AA may be disposed in the peripheral area NAA.

In this embodiment, a portion of the peripheral area NAA of the electronic panel EP may be bent. For example, the electronic panel EP may include a flat part FN and a bent part BN. The flat part FN may be assembled in a state of being substantially parallel to a plane defined by the first and second directions DR1 and DR2. The active area AA may be provided on the flat part FN.

The bent part BN may extend from the flat part FN and may be bent along a virtual bending axis. The bent part BN may be bent to face a rear surface of the flat part FN and then assembled with the flat part FN. When assembled, since the bent part BN overlaps the flat part FN on a plane, the bezel area BZA of the electronic device 1000 may be reduced. This is merely an example, and in the electronic panel EP, the bent part BN may be omitted.

The driving circuit IC may be mounted on the bent part BN. The driving circuit IC is shown as an embodiment provided in the form of a chip, but is not limited thereto, and may be provided on a separate circuit board to be electrically connected to the electronic panel EP through a flexible film or the like.

The driving circuit IC may be electrically connected to the active area AA to transmit an electrical signal to the active area AA. For example, the driving circuit IC may include a data driving circuit and provide data signals to the pixels PXij disposed on the active area AA. Alternatively, the driving circuit IC may include a touch driving circuit and may be electrically connected to an input sensor disposed on the active area AA. This is merely an example, and the driving circuit IC may include various circuits in addition to the above-described circuits or may be designed to provide various electrical signals to the active area AA, but is not limited to a specific embodiment.

The electronic device 1000 according to an embodiment may further include a main circuit board electrically connected to the electronic panel EP and the driving circuit IC. The main circuit board MCB may include various driving circuits that drive the electronic panel EP and a connector for supplying power. The main circuit board may be a rigid printed circuit board (PCB), but is not limited thereto, and may also be a flexible circuit board, but is not limited to a specific embodiment.

The electronic module 400 is disposed below the display module 100. The electronic module 400 may receive an external input transmitted through the first area A1 or output a signal through the first area A1. For example, when the electronic module 400 is camera, the camera may receive light through the first area A1 and output light through the first area A1. According to an embodiment of the inventive concept, the electronic module 400 may be disposed to overlap the active area AA by providing the first area A1 having a relatively high transmittance inside the active area AA. Thus, the bezel area BZA may be prevented from increasing in size.

A housing 200 may be coupled to the window 300 to provide a predetermined internal space and define an outer appearance of the electronic device 1000. Components of the electronic device 1000, such as the display module 100 and the electronic module 400, may be accommodated in the internal space.

The housing 200 may include a material having relatively high rigidity. For example, the housing 200 may include glass, plastic, or a metal or may include a plurality of frames and/or plates made of a combination of glass, plastic, and a metal. The housing 200 may stably protect components of the electronic device 1000 accommodated in the internal space from external impact.

Referring to FIG. 3, the electronic device 1000 may include the display module 100 (e.g., a display device), a power supply module PM (e.g., a power supply or power supply device), a first electronic module EM1 (e.g., a first electronic device), and a second electronic module EM2 (e.g., a second electronic device). The display module 100, the power supply module PM, the first electronic module EM1, and the second electronic module EM2 may be electrically connected to each other.

In FIG. 3, the display panel 110 and the input sensor 120 among the components of the display module 100 are illustrated as an example. The display panel 110 may be a component that generates the image IM. The image IM generated by the display panel 110 is displayed on the display surface FS through the light transmission area TA and is visually recognized by the user from the outside. The input sensor 120 senses the external input TC applied from the outside. As described above, the input sensor 120 may sense the external input TC provided to the window 300.

The power supply module PM supplies power required for an overall operation of the electronic device 1000. The power supply module PM may include a general battery module (e.g., one or more batteries).

The first electronic module EM1 and the second electronic module EM2 may include various functional modules for driving the electronic device 1000. The first electronic module EM1 may be directly mounted on a mother board electrically connected to the electronic panel EP or may be mounted on a separate board and electrically connected to the mother board through a connector.

The first electronic module EM1 may include a control module CM (e.g., a control circuit), a wireless communication module TM (e.g., a transceiver), an image input module IM (e.g., an input circuit), an audio input module AIM (e.g., a microphone), a memory MM, and an external interface IF (e.g., an interface circuit). A portion of the modules may not be mounted on the mother board but electrically connected to the mother board through a flexible circuit board.

The control module CM controls an overall operation of the electronic device 1000. The control module CM may be a microprocessor. For example, the control module CM may activate or deactivate the display module 100. The control module CM may control other modules such as the image input module IIM or the audio input module AIM on the basis of a touch signal received from the electronic panel EP.

The wireless communication module TM may transmit/receive a wireless signal to/from the other terminal by using Bluetooth or a Wi-Fi line. The wireless communication module TM may transmit/receive an audio signal by using a general communication line. The wireless communication module TM includes a transmitter TM1 modulating and transmitting a signal to be transmitted and a receiver TM2 receiving the transmitted signal and demodulating the received signal.

In an embodiment, the image input module IIM processes the image signal to convert the processed image signal into image data that is capable of being displayed on the electronic panel EP. The audio input module AIM may receive external audio signals by using a microphone during a recording mode or a voice recognition mode to convert the received audio signal into electrical sound data.

The external interface IF may serve as an interface connected to an external charger, a wired/wireless data port, and a card socket (for example, a memory card and an SIM/UIM card).

The second electronic module EM2 may include an audio output module AOM (e.g., a speaker), a light emitting module LM (e.g., a light source), a light receiving module LRM (e.g., a light sensor), and a camera module CMM (e.g., a camera). The above-described constituents may be directly mounted on the mother board, may be mounted on a separate board and electrically connected to the electronic panel EP through a connector, or may be electrically connected to the first electronic module EM1.

The audio output module AOM converts audio data received from the wireless communication module TM or audio data stored in the memory MM to output the converted audio data to the outside.

The light emitting module LM generates and outputs light. The light emitting module LM may output infrared rays. The light emitting module LM may include a light-emitting-diode (LED). The light receiving module LRM may sense the infrared rays. The light receiving module LRM may be activated when infrared rays having a predetermined level or more is sensed. The light receiving module LRM may include a complementary-metal-oxide-semiconductor (CMOS) sensor. The infrared rays generated in the light emitting module LM may be outputted and then be reflected by an external object (for example, a user's finger or face), and the reflected infrared rays may be incident into the light receiving module LRM. The camera module CMM photographs an external image.

The electronic module 400 according to an embodiment of the inventive concept may include at least one of the components of the second electronic module EM2. For example, the electronic module 400 may include at least one of a camera, a speaker, an optical detection sensor, or a thermal detection sensor. The electronic module 400 may sense an external subject received through the first area A1 or provide a sound signal such as voice to the outside through the first area A1. Also, the electronic module 400 may include a plurality of constituents, but is not limited to a specific embodiment. Although not shown, the electronic module 400 may be attached to the electronic panel EP through a separate adhesive.

FIG. 4 illustrates a portion XX' of the active area AA adjacent to the module hole MH of the display panel 110 (see FIG. 3).

Referring to FIG. 4, most of the pixels PX among the pixels PX provided in the display panel 110 may be disposed on the second area A2, and some of the pixels PX may be disposed on the second area A2 along a boundary between the first area A1 and the second area A2 and spaced apart from the first area A1.

The module hole MH may be defined in the active area AA. Thus, at least a portion of the pixels PX may be disposed adjacent to the module hole MH and spaced apart from each other with the module hole MH therebetween.

At least one tip part TIP may be defined on the first area A1 of the display panel 110. According to an embodiment, the electronic device 1000 (see FIG. 2) may block a path through which moisture and/or oxygen is introduced from the module hole MH to the pixels PX by the tip part TIP. Thus, the display panel 110 having increased quality may be provided. A detailed description of the tip part TIP will be described later.

The tip part TIP overlaps the first area A1 on the plane or in a plan view and is disposed along an edge of the module hole MH. The tip part TIP may be disposed closer to the second area A2 than the module hole MH. In a plane or in a plan view, the tip part TIP may have a closed-line shape surrounding the module hole MH.

A filling part RS may be disposed inside the module hole MH. The filling part RS may include a polymer resin. The filling part RS may be disposed inside the module hole MH to provide a flat surface to the components disposed on the module hole MH. A description of the filling part RS will be described later.

Although each of the shapes of the tip part TIP and the module hole MH on the plane is shown as a circular shape in FIG. 4, the shapes of the tip part TIP and the module hole MH may be different from each other. In addition, each of the tip part TIP and the module hole MH may have a closed-line shape including a polygonal shape, an oval shape, or at least partial circular shape, or may be provided in a shape including a plurality of partially disconnected patterns, but is not limited to a specific embodiment.

A portion of each of the plurality of signal lines SGL1 and SGL2 connected to the pixels PX may be disposed on the first area A1. The signal lines SGL1 and SGL2 are connected to the pixels PX spaced apart from each other with the module hole MH therebetween via the first area A1. In FIG. 4, for convenience of description, two signal lines SGL1 and SGL2 among the plurality of signal lines connected to the pixels PX are illustrated as an example.

The first signal line SGL1 extends in the first direction DR1. The first signal line SGL1 is connected to the pixels within the same row arranged in the first direction DR1 of the pixels PX. The first signal line SGL1 will be exemplarily described as corresponding to any one of scan lines connected to the pixels PX.

A portion of the pixels PX connected to the first signal line SGL1 may be disposed at the left side of the module hole MH, and another portion of the pixels PX connected to the first signal line SGL1 may be disposed at the right side of the module hole MH. Thus, the pixels in the same row connected to the first signal line SGL1 may be turned on/off by substantially the same gate signal even though a portion of the pixels PX with respect to the module hole MH is omitted. The first signal line SGL1 may have a first portion extending in the first direction DR1 to connect to pixels PX disposed to the left side of the module hole MH, a second portion extending in the first direction DR1 to connect to pixels PX disposed to the right side of the module hole MH, and a curved portion that curves around the tip part TIP to connect the first portion to the second portion.

The second signal line SGL2 extends in the second direction DR2. The second signal line SGL2 is connected to the pixels of the pixels PX in the same column arranged in the second direction DR2. The second signal line SGL2 will be exemplarily described as corresponding to any one of the data lines connected to the pixels PX.

A portion of the pixels PX connected to the second signal line SGL2 may be disposed above the module hole MH, and another portion of the pixels PX connected to the second signal line SGL2 may be disposed below the module hole MH. Thus, the pixels in the same row connected to the second signal line SGL2 may receive a data signal through the same line even though a portion of the pixels with respect to the module hole MH is omitted. The second signal line SGL2 may have a first portion extending in the second direction DR2 to connect to pixels PX disposed above the module hole MH, a second portion extending in the second direction DR2 to connect to pixels PX disposed below the module hole MH, and a curved portion that curves around the tip part TIP to connect the first portion to the second portion.

At least one of the first signal line SGL1 or the second signal line SGL2 may be disconnected within the first area A1 at a point at which the first signal line SGL1 and the second signal line SGL2 cross each other, and a connection pattern disposed on a different layer from the disconnected signal line to connect the disconnected portions may be further provided. However, the connection relationship between the pixels PX spaced apart with the module hole MH therebetween is not limited thereto.

Figure 5:
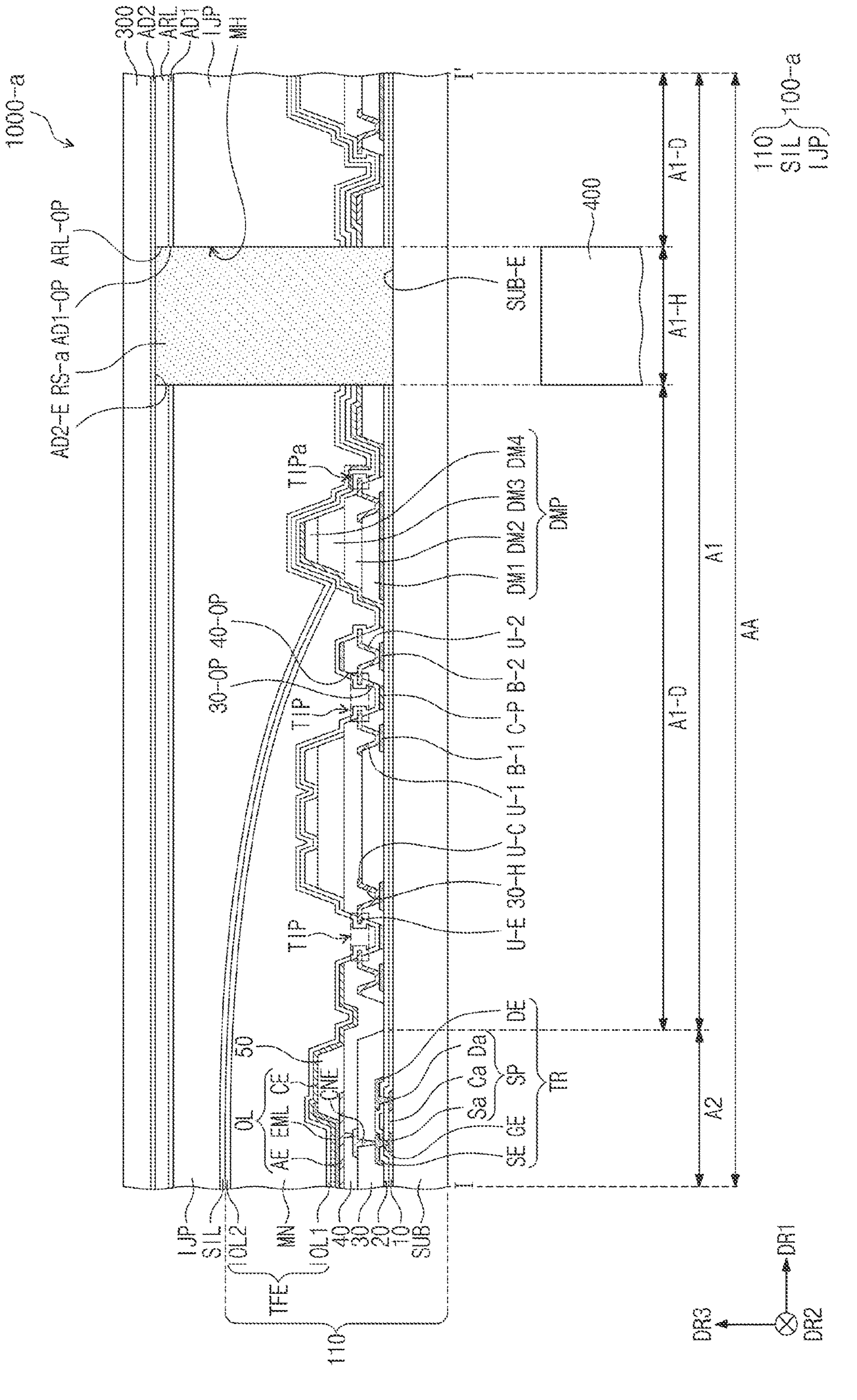
FIG. 5 is a cross-sectional view taken along line I-I' of FIG. 2.

FIG. 5 is a cross-sectional view taken along line I-I' of FIG. 2. In FIG. 5, the housing 200 described in FIG. 1 is omitted.

Referring to FIG. 5, an electronic device 1000-*a* according to an embodiment includes a display module 100-*a*, an anti-reflection layer ARL, a window 300, an electronic module 400, and adhesive layers AD1 and AD2. The display module 100-*a* may be used to implement the display module 100 of FIG. 2 and FIG. 3. The display module 100-*a* may include a display panel 110, a cover inorganic layer SIL, and a cover organic layer IJP. A description of the window 300 may correspond to that described in FIGS. 1 and 2.

The display module 100-*a* may include a first area A1 and a second area A2 surrounding at least a portion of the first area A1. The first area A1 may include a blocking area A1-D and a hole area A1-H.

The display panel 110 may include a base layer SUB, a circuit element layer, a display element layer, and an encapsulation layer TFE. The circuit element layer may include a transistor TR and insulating layers 10, 20, 30, and 40. The display element layer may include a pixel defining layer 50 and a light emitting element OL.

The base layer SUB may include a base surface on which display elements and signal lines constituting the display panel 110 are disposed. An insulating layer, a semiconductor layer, and a conductive layer may be formed on the base layer SUB by coating, deposition, or the like. Thereafter, the insulating layer, the semiconductor layer, and the conductive layer may be selectively patterned using a photolithography process. In this manner, semiconductor patterns, conductive patterns, signal lines, and the like may be formed.

The base layer SUB according to an embodiment may be provided in the form of a multi-layer film in which inorganic layers and organic layers are alternately laminated. However, the embodiment of the inventive concept is not limited thereto, and the base layer SUB may be provided as a single layer. In this case, the base layer SUB may include a synthetic resin film or may include any one of glass and a metal. The synthetic resin film may contain a thermosetting resin. The synthetic resin film may be a polyimide resin layer, but the material thereof is not limited thereto. The first area A1 and the second area A2 may be defined on the base layer SUB.

A transistor TR may be disposed on the base layer SUB. The transistor TR may include a semiconductor pattern SP, a source electrode SE, a drain electrode DE, and a gate electrode GE.

The semiconductor pattern SP may be disposed on the base layer SUB. The semiconductor pattern SP may include a silicon semiconductor, for example, a single-crystal silicon semiconductor, a poly-silicon semiconductor, or an amorphous silicon semiconductor. However, the embodiment of the inventive concept is not limited thereto, and the semiconductor pattern SP may include an oxide semiconductor. The semiconductor pattern SP according to an embodiment of the inventive concept may be made of various materials having semiconductor properties, but is not limited to a specific embodiment.

The circuit element layer may be disposed on the base layer SUB. The circuit element layer may include a transistor TR and insulating layers 10, 20, 30, and 40.

The semiconductor pattern SP of the transistor TR may be disposed on the base layer SUB. The semiconductor pattern SP may include a source region Sa, a drain region Da, and a channel region Ca. The semiconductor pattern SP may be divided into a plurality of regions according to conductivity. For example, electrical properties of the semiconductor pattern may vary according to whether the semiconductor pattern SP is doped, or metal oxide is reduced. A region having high conductivity in the semiconductor pattern SP may serve as an electrode or a signal line and may correspond to the source region Sa and the drain region Da of the transistor TR. The non-doped or non-reduced region having relatively low conductivity may correspond to the channel region Ca (an active region) of the transistor TR.

The circuit element layer according to an embodiment may further include a barrier layer and/or a buffer layer disposed between the semiconductor pattern SP and the base layer SUB. The barrier layer may include an inorganic material. For example, the barrier layer may include at least one of silicon oxide, aluminum oxide, titanium oxide, silicon nitride, silicon oxynitride, zirconium oxide, or hafnium oxide.

The buffer layer may be disposed on the barrier layer or may be directly disposed on the base layer SUB when the barrier layer is omitted. The buffer layer may increase bonding strength between the barrier layer and the semiconductor pattern SP and/or the conductive pattern. The buffer layer may include a silicon oxide layer and a silicon nitride layer. In addition, the silicon oxynitride layer may have a single-layer or multi-layer structure, but is not limited to a specific embodiment.

A first insulating layer 10 may be disposed on the base layer SUB to cover the semiconductor pattern SP of the transistor TR. In an embodiment, the first insulating layer 10 may include an inorganic layer having a single-layer or multi-layer structure.

The gate electrode GE may be disposed on the first insulating layer 10. The gate electrode GE may overlap the channel region Ca on the plane or in a plan view. In an embodiment, the gate electrode GE may function as a mask in a process of doping the semiconductor pattern SP.

A second insulating layer 20 may be disposed on the first insulating layer 10 to cover the gate electrode GE. In an embodiment, the second insulating layer 20 may include an inorganic layer having a single-layer or multi-layer structure.

A source electrode SE and a drain electrode DE may be disposed on the second insulating layer 20. The source electrode SE may be connected to the source region Sa of the semiconductor pattern SP through a contact hole passing through the first and second insulating layers 10 and 20. The drain electrode DE may be connected to the drain region Da of the semiconductor pattern SP through the contact hole passing through the first and second insulating layers 10 and 20. The source electrode SE and the drain electrode DE may be spaced apart from each other on the second insulating layer 20.

The third insulating layer 30 may be disposed on the second insulating layer 20 to cover the source electrode SE and the drain electrode DE. In an embodiment, the third insulating layer 30 may include an organic layer. The third insulating layer 30 including an organic layer may cover a stepped portion between the components disposed below to provide a flat surface.

The circuit element layer according to an embodiment may further include a connection electrode CNE. The connection electrode CNE may be disposed on the third insulating layer 30. The connection electrode CNE may electrically connect the transistor TR to the light emitting element OL. In an embodiment, the connection electrode CNE may be connected to the drain electrode DE through a contact hole penetrating the third insulating layer 30.

A fourth insulating layer 40 may be disposed on the third insulating layer 30 to cover the connection electrode CNE. In an embodiment, the fourth insulating layer 40 may include an organic layer. The fourth insulating layer 40 including an organic layer may provide a flat surface.

The circuit element layer is not limited to the illustrated embodiment and may further include an insulating layer and/or a connection electrode. At least one insulating layer may be provided to be disposed between the first to fourth insulating layers 10, 20, 30, and 40, or may be additionally disposed below the first insulating layer 10 or above the fourth insulating layer 40. The circuit element layer may have various cross-sectional structures according to a circuit design and is not limited to a specific embodiment.

The display element layer may be disposed on the circuit element layer. The display element layer may include the light emitting element OL and the pixel defining layer 50.

The light emitting element OL may be disposed on the second area A2. The light emitting element OL may include a pixel electrode AE, an emission layer EML, and a common electrode CE. The light emitting device OL according to an embodiment may further include a hole control layer disposed between the pixel electrode AE and the emission layer EML, and an electron control layer disposed between the emission layer EML and the common electrode CE. Each of the common electrode CE, the hole control layer, and the electron control layer may be formed over an entire area of the first area A1 and the second area A2. Each of the common electrode CE, the hole control layer, and the electron control layer may be formed over the entire area of the active area AA by being deposited through an open mask. The common electrode CE, the hole control layer, and the electron control layer may be defined as a common layer.

In an embodiment, the pixel electrode AE may be an anode electrode, and the common electrode CE may be a cathode electrode. For example, the light emitting element OL may include an organic light emitting element, a quantum dot light emitting element, a micro LED light emitting element, or a nano LED light emitting element. However, the embodiment of the inventive concept is not limited thereto, and the light emitting element OL may include various embodiments as long as light is generated, or the amount of light is controlled according to an electrical signal.

The pixel electrode AE may be disposed on the fourth insulating layer 40. The pixel electrode AE may be connected to the connection electrode CNE through a contact hole passing through the fourth insulating layer 40. The pixel electrode AE may be electrically connected to the drain region Da of the transistor TR through the connection electrode CNE and the drain electrode DE.

The pixel defining layer 50 may be disposed on the fourth insulating layer 40. The pixel defining layer 50 may include a light emitting opening exposing a portion of the pixel electrode AE. A portion of the pixel electrode AE exposed by the light emitting opening may correspond to the emission area.

The pixel defining layer 50 may be made of a polymer resin. For example, the pixel defining layer 50 may include a polyacrylate-based resin or a polyimide-based resin. The pixel defining layer 50 may further include an inorganic material in addition to the polymer resin. Also, the pixel defining layer 50 may be made of an inorganic material. For example, the pixel defining layer 50 may include any one of silicon nitride, silicon oxide, and silicon nitride oxide.

In an embodiment, the pixel defining layer 50 may include a light absorbing material. The pixel defining layer 50 may include a black coloring agent. A black component may include a black dye or a black pigment. The black component may include carbon black, a metal such as chromium, or oxide thereof.

The emission layer EML may be disposed on the pixel electrode AE. The emission layer EML may be disposed on an area corresponding to the emission opening. That is, the emission layer EML may be disposed to correspond to each of the pixels PX (see FIG. 4), and the emission layers EML of the pixels PX (see FIG. 4) may be formed in the form of emission patterns separated from each other on the plane or in a plan view. Unlike the common layer, the emission layers EML may be deposited using a mask including a pattern, such as a fine metal mask (FMM).

The emission layer EML may provide light of a predetermined color. The emission layer EML may emit one of red light, green light, and blue light. However, the embodiment of the inventive concept is not limited thereto. For example, the emission layer EML may generate white light by the combination of light emitting materials that respectively generate red, green, and blue light.

The emission layer EML may include an organic light emitting material and/or an inorganic light emitting material. For example, the emission layer EML may include a fluorescent or phosphorescent material, a metal organic complex light emitting material, or quantum dots. In an embodiment, the emission layer EML may have a multi-layer structure. For example, the emission layer EML may include a main emission layer and an auxiliary emission layer disposed on the main emission layer. The main emission layer and the auxiliary emission layer may have different thicknesses according to a wavelength of the emitted light, and a resonance distance of the light emitting element OL may be adjusted by disposing the auxiliary emission layer. In addition, color purity of light output from the emission layer EML may be improved by disposing the auxiliary emission layer.

The cathode electrode CE may be disposed on the emission layer EML. The common electrode CE may be commonly disposed in the pixels PX (see FIG. 4) to provide a common voltage. The common electrode CE may extend from the second area A2 to overlap a blocking area A1-D.

Each of the pixel electrode AE and the common electrode CE may be a transmissive electrode, a transflective electrode, or a reflective electrode. The transmissive electrode may include transparent metal oxide such as indium tin oxide (ITO), indium zinc oxide (IZO), zinc oxide (ZnO), or indium tin zinc oxide (ITZO). The transflective or reflective electrode may include Ag, Mg, Cu, Al, Pt, Pd, Au, Ni, Nd, Ir, Cr, Li, Ca, LiF/Ca (laminated structure of LiF and Ca), LiF/Al (laminated structure of LiF and Al), Mo, Ti, Yb, W, or a compound or mixture thereof (e.g., AgMg, AgYb, or MgYb).

Alternatively, the pixel electrode AE or the common electrode CE may have a multiple layer structure including the reflective layer or transflective layer, which is made of the above-described material, indium tin oxide (ITO), indium zinc oxide (IZO), zinc oxide (ZnO), or indium tin zinc oxide (ITZO). For example, the electrode having a plurality of layer structures may have a three-layer structure of ITO/Ag/ITO, but is not limited thereto.

The encapsulation layer TFE may be disposed on the light emitting element OL to cover (seal) the light emitting element OL. The encapsulation layer TFE may include at least one insulating layer. In an embodiment, the encapsulation layer TFE may include a plurality of inorganic layers IOL1 and IOL2 and at least one organic layer MN disposed between the inorganic layers IOL1 and IOL2. The first inorganic layer IOL1 may be disposed on the common electrode CE. The organic layer MN and the second inorganic layer IOL2 may be sequentially disposed on the first inorganic layer IOL1.

The first and second inorganic layers IOL1 and IOL2 may protect the light emitting element OL against moisture and/or oxygen. The first and second inorganic layers IOL1 and IOL2 may include at least one of aluminum oxide, titanium oxide, silicon oxide, silicon nitride, silicon oxynitride, zirconium oxide, or hafnium oxide. However, the material of each of the first and second inorganic layers IOL1 and IOL2 is not limited to the above example.

The organic layer MN may protect the light emitting element OL against foreign substances such as dust particles. For example, the organic layer MN may include an acryl-based resin. However, the material of the organic layer MN is not limited to the above examples.

The cover inorganic layer SIL may be disposed on the display panel 110. For example, the cover inorganic layer SIL may be disposed on the second inorganic layer IOL2. The cover inorganic layer SIL may include an inorganic material. For example, the cover inorganic layer SIL may include at least one of aluminum oxide, titanium oxide, silicon oxide, silicon nitride, silicon oxynitride, zirconium oxide, or hafnium oxide.

The cover organic layer IJP may be disposed on the cover inorganic layer SIL. The cover organic layer IJP may compensate for a height difference formed on the display panel 110. Thus, a flat surface may be provided to the components disposed on the display panel 110. The cover organic layer IJP may include an organic material. The cover organic layer IJP may be formed on the cover inorganic layer SIL by an inkjet process.

An anti-reflection layer ARL may be disposed on the cover organic layer IJP. The anti-reflection layer ARL may be disposed between the cover organic layer IJP and the window 300. The anti-reflection layer ARL may reduce reflection of light incident from the outside of the electronic device 1000-*a*. That is, the anti-reflection layer ARL may reduce external light reflectance of the electronic device 1000-*a*. The anti-reflection layer ARL according to an embodiment may include a polarization layer, a phasor, a destructive interference structure, or a plurality of color filters.

A first adhesive layer AD1 may be disposed between the anti-reflection layer ARL and the cover organic layer IJP to couple the anti-reflection layer ARL to the cover organic layer IJP. The first adhesive layer AD1 may include at least one of an optically clear adhesive, an optically clear adhesive resin, or a pressure sensitive adhesive (PSA).

The window 300 may be disposed on the anti-reflection layer ARL. A second adhesive layer AD2 may be disposed between the anti-reflection layer ARL and the window 300 to couple the anti-reflection layer ARL to the window 300. The second adhesive layer AD2 may include the same material as the first adhesive layer AD1. For example, the second adhesive layer AD2 may be disposed between the anti-reflection layer ARL may be formed on the anti-reflection layer ARL, and the window 300 may be formed on the second adhesive layer AD2.

A module hole MH may be defined in the display module 100-*a* according to an embodiment. The module hole MH may correspond to the hole area A1-H of the first area A1. According to an embodiment of the inventive concept, a location, number, and shape of the first area A1 defined in the display module 100-*a* may correspond to a location, number, and shape of the electronic module 400 disposed under the base layer SUB, respectively. For example, a portion of the display module 100*a* may be removed to form the module hole MH.

The circuit element layer, the display element layer, and the encapsulation layer TFE overlapping the hole area A1-H of the first area A1 of the display panel 110 may pass through the module hole MH. The cover inorganic layer SIL and the cover organic layer IJP overlapping the hole area A1-H of the first area A1 may be formed to pass through the module hole MH. The module hole MH according to an embodiment may expose a portion SUB-E on a top surface of the base layer SUB, which overlaps the hole area A1-H.

According to this embodiment, the display module 100-*a* may include a filling part RS-a disposed inside the module hole MH. The filling part RS-a may compensate for a height difference formed as the components of the display panel 110 are removed in the process of forming the module hole MH. For example, a laser may be used to form the module hole MH. The filling part RS-a according to an embodiment may include a polymer resin. For example, the filling part RS-a may include at least one of silicone, acrylic resin, urethane resin, or epoxy.

The first adhesive layer AD1 according to an embodiment may include a first opening AD1-OP corresponding to the module hole MH. The anti-reflection layer ARL may include a hole opening ARL-OP corresponding to the first opening AD1-OP. Thus, the first opening AD1-OP and the hole opening ARL-OP may expose a portion AD2-E of a rear surface of the second adhesive layer AD2, which overlaps the hole area A1-H.

In an embodiment, a width of each of the first opening AD1-OP and the hole opening ARL-OP in the first direction DR1 is the same as a width of the module hole MH. According to an embodiment, the filling part RS-a may be disposed inside the first opening AD1-OP and the hole opening ARL-OP.

The filling part RS-a according to an embodiment may be in contact with side surfaces of the insulating layers, side surfaces of the common electrode CE, side surfaces of the first and second inorganic layers IOL1 and IOU of the encapsulation layer TFE, side surfaces of the cover inorganic layer SIL, and side surfaces of the cover organic layer IJP, which define the module hole MH. In addition, the filling portion RS-a may be in contact with side surfaces of the first adhesive layer AD1 defining the first opening AD1-OP and side surfaces of the anti-reflection layer ARL defining the hole opening ARL-OP and may be in contact with a portion SUB-E of the base layer SUB and a portion AD2-E of the second adhesive layer AD2.

According to an embodiment of the inventive concept, even if the module hole MH, in which a portion of the display module 100-*a* is removed to dispose the electronic module 400 inside the active area AA, is defined, since the filling part RS-a is disposed inside the module hole MH, a flat surface may be provided on the components overlapping the module hole MH.

According to an embodiment of the inventive concept, even though the anti-reflection layer ARL is disposed on the display panel 110 including the module hole MH, the anti-reflection layer ARL may be disposed to be flat on the display panel 110 due to the filling part RS-a. For example, the anti-reflection layer ARL may be disposed flush with a surface of the display panel 110 due to the filling part RS-a.

Therefore, deformation of the shape such as inclination of the anti-reflection layer ARL at the portion adjacent to the module hole MH may be prevented from occurring, and also, an observable waviness due to interference with reflected light introduced into the module hole MH through the window 300 may be prevented from occurring.

The circuit element layer of the display panel 110 according to an embodiment may further include a dam part DMP disposed on the blocking area A1-D of the first area A1. The dam part DMP may be disposed between the module hole MH and the second area A2 and may surround the module hole MH.

The dam part DMP may include first to fourth parts DM1, DM2, DM3, and DM4, which are sequentially laminated. Each of the first to fourth parts DM1, DM2, DM3, and DM4 may include an organic material. For example, the first to fourth parts DM1, DM2, DM3, and DM4 may be stacked on top of one another. For example, at least one of the first to fourth portions DM1, DM2, DM3, and DM4 may include the same material as the insulating layer containing the organic material among the first to fourth insulating layers 10, 20, 30, and 40.

A portion of the dam part DMP may be covered by the common electrode CE. The remaining portion of the dam part DMP may be covered by the first inorganic layer IOL1 of the encapsulation layer TFE. The dam part DMP may define a boundary of the organic layer MN within the blocking area A1-D. Thus, the organic layer MN may surround the module hole MH along the dam part DMP.

The circuit element layer may further include protruding patterns U-1 and U-2, lower patterns B-1 and B-2, and tip patterns C-P disposed on the blocking area A1-D. The third insulating layer 30 (lower insulating layer) may include a lower opening 30-OP overlapping the blocking area A1-D, and the fourth insulating layer 40 (upper insulating layer) may include an upper opening 40-OP overlapping the blocking area A1-D. The lower opening 30-OP and the upper opening 40-OP may correspond to each other. The lower opening 30-OP and the upper opening 40-OP overlapping each other may be defined as one tip opening.

Each of the protruding patterns U-1 and U-2 may include one side U-E and another side U-C. The one side U-E of the first protruding pattern U-1 may protrude between the side surfaces of the third insulating layer 30 and the side surfaces of the fourth insulating layer 40, which define the tip opening, and the other side U-C of the first protruding pattern U-1 may be disposed between the third insulating layer 30 and the fourth insulating layer 40.

A portion of the first protruding pattern U-1 disposed between the third insulating layer 30 and the fourth insulating layer 40 may be connected to the corresponding first lower pattern B-1 through a contact hole 30-H provided in the third insulating layer 30.

The one side U-E of the second protruding pattern U-2 may protrude between the side surfaces of the third insulating layer 30 and the side surfaces of the fourth insulating layer 40, which define the tip opening, and the other side U-C of the second protruding pattern U-2 may be disposed between the third insulating layer 30 and the fourth insulating layer 40.

A portion of the second protruding pattern U-2 disposed between the third insulating layer 30 and the fourth insulating layer 40 may be connected to the corresponding second lower pattern B-2 through a contact hole 30-H provided in the third insulating layer 30.

The circuit element layer may include a tip part TIP. One tip part TIP may be defined by the lower opening 30-OP, the upper opening 40-OP, and the one sides U-E provided from the corresponding tip opening among the different protruding patterns U-1 and U-2. The one sides U-E provided in the different protruding patterns U-1 and U-2 may face each other at the tip part TIP.

The circuit element layer may further include a half tip part TIPa. In the half tip part TIPa, only one side U-E of one of the protruding patterns U-1 and U-2 may protrude from the corresponding tip opening. Although FIG. 5 illustrates two tip parts TIP and two half tips TIPa, the number of tip parts TIP and half tips TIPa is not limited thereto, and the half tip part TIPa may be omitted.

The tip parts TIP and the half tip parts TIPa may surround the module hole MH and may have a closed-line shape (see FIG. 4) on the plane or in a plan view.

The tip patterns C-P may be disposed in the corresponding tip openings. The tip patterns C-P may include the same material as the above-described common layer. For example, the tip patterns C-P may include the same material as at least one of the common electrode CE, the hole control layer, or the electron control layer. The tip patterns C-P may be disconnected by the tip parts TIP and the half tip parts TIPa during the process of forming the common layer on the entire surface of the active area AA.

According to an embodiment of the inventive concept, since the tip patterns C-P including the same material as the common layer are disconnected from the tip parts TIP and the half tip parts TIPa, a path through which moisture and/or oxygen is introduced into the light emitting element OL through the module hole MH may be blocked. Thus, even if the module hole MH is formed inside the active area AA, the display panel 110 having increased quality may be provided.

Figure 6:
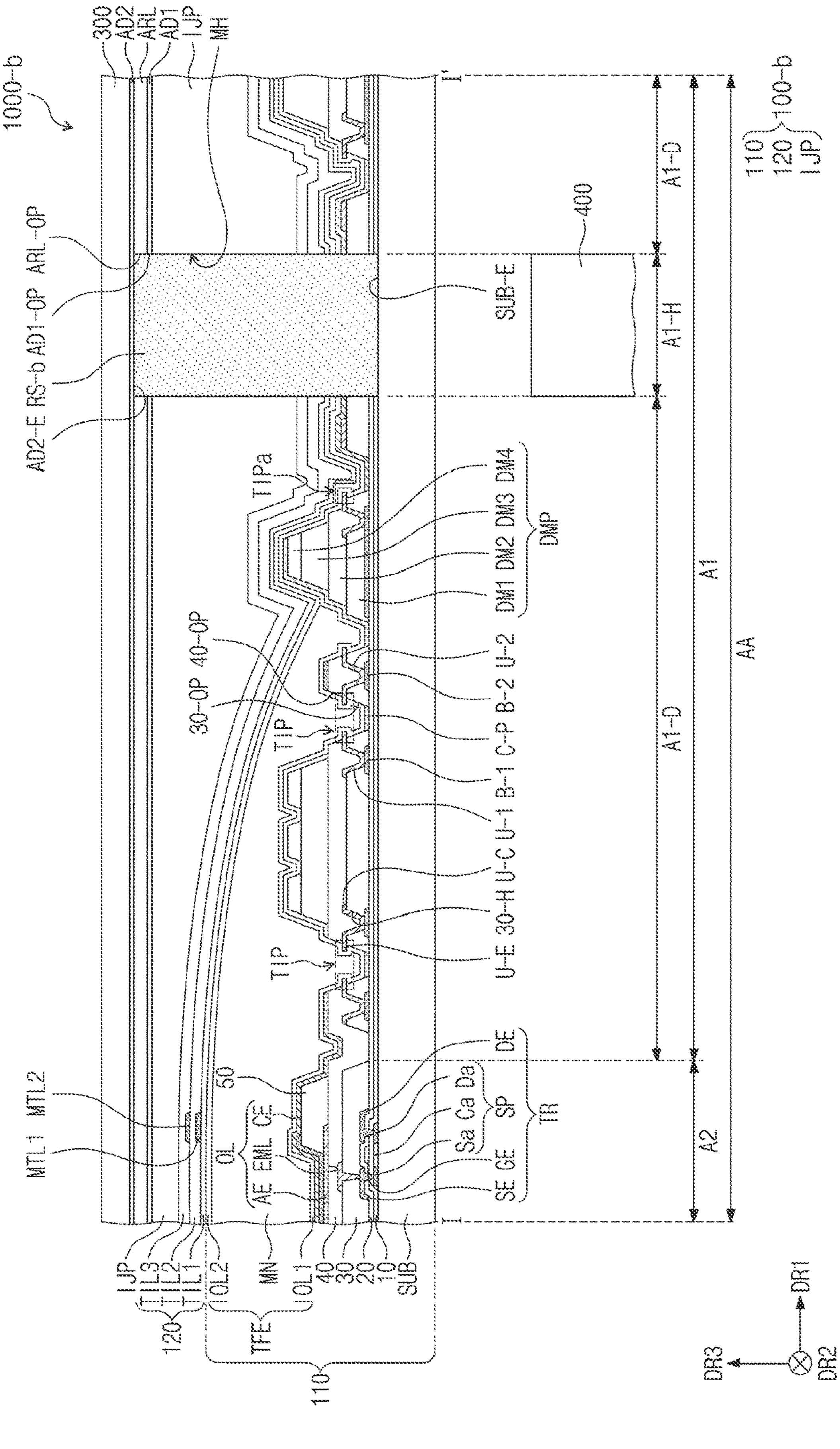
FIG. 6 is a cross-sectional view of an electronic device according to an embodiment of the inventive concept.

FIG. 6 is a cross-sectional view of an electronic device according to an embodiment of the inventive concept. FIG. 6 is a cross-sectional view of a region corresponding to that of FIG. 5, and the same/similar reference numerals are used for the same components as those of FIG. 5, and thus, duplicated descriptions thereof will be omitted.

Referring to FIG. 6, an electronic device 1000-*b* according to an embodiment includes a display module 100-*b*, an anti-reflection layer ARL, a window 300, an electronic module 400, and adhesive layers AD1 and AD2. The display module 100-*b* may be used to implement the display module 100 of FIG. 2 and FIG. 3. The display module 100-*b* may include a display panel 110, an input sensor 120 (e.g., input sensing device), and a cover organic layer IJP. Descriptions of the display panel 110, the cover organic layer IJP, and the window 300 may correspond to those described with reference to FIG. 5. In the electronic device 1000-*b* according to an embodiment, when comparing the electronic device 1000-*a* defined with reference to FIG. 5, the cover inorganic layer SIL (see FIG. 5) may be omitted, and an input sensor 120 may be added. For example, the cover inorganic layer SIL may be replaced with the input sensor 120. Therefore, in FIG. 6, the input sensor 120 will be mainly described.

The input sensor 120 may sense a user's input TC (see FIG. 1) applied from the outside. The user's input TC (see FIG. 1) may include various types of external inputs such as a portion of a user's body, light, heat, a pen, a pressure, or the like.

The input sensor 120 may be disposed on the display panel 110. For example, the input sensor 120 may be directly disposed on an encapsulation layer TFE. For example, the input sensor 120 may contact the encapsulation layer TFE. The input sensor 120 may include conductive patterns MTL1 and MTL2 and sensing insulating layers TIL1, TIL2 and TIL3. The sensing insulating layers TIL1, TIL2, and TIL3 may include a first sensing insulating layer TIL1, a second sensing insulating layer TIL2, and a third sensing insulating layer TIL3. The conductive patterns MTL1 and MTL2 may overlap a pixel defining layer 50 and may be spaced apart from a light emitting element OL.

The first sensing insulating layer TIL1 is disposed on the encapsulation layer TFE. The first conductive patterns MTL1 may be disposed on the first sensing insulating layer TIL1 and covered by the second sensing insulating layer TIL2. The second conductive patterns MTL2 may be disposed on the second sensing insulating layer TIL2 and covered by the third sensing insulating layer TIL3.

Each of the conductive patterns MTL1 and MTL2 has conductivity. Each of the conductive patterns MTL1 and MTL2 may be provided as a single layer or a plurality of layers, and is not limited to a specific embodiment. At least one or more conductive patterns MTL1 and MTL2 according to an embodiment of the inventive concept may be provided as mesh lines on a plane in a plan view.

The mesh lines constituting the conductive patterns MTL1 and MTL2 may overlap a pixel defining layer 50 and may be spaced apart from an emission layer EML. Therefore, even if the input sensor 120 is directly disposed on the display panel 110, light generated by pixels PXij (see FIG. 2) of a display panel 110 may be provided to a user without interfering with an input sensor 120.

The cover organic layer IJP may be disposed on the third sensing insulating layer TIL3. For example, the cover organic layer IJP may contact the third sensing insulating layer TIL3. The cover organic layer IJP may compensate for a height difference formed on the display panel 110. Thus, a flat surface may be provided to the components disposed on the display panel 110. The cover organic layer IJP may include an organic material. The cover organic layer IJP may be disposed on the third sensing insulating layer TIL3 by an inkjet process.

An anti-reflection layer ARL may be disposed on the cover organic layer IJP. The anti-reflection layer ARL may be disposed between the cover organic layer IJP and the window 300. For example, the anti-reflection layer ARL may contact the cover organic layer IJP and the window 300. A first adhesive layer AD1 may be disposed between the anti-reflection layer ARL and the cover organic layer IJP to couple the anti-reflection layer ARL to the cover organic layer IJP. For example, the first adhesive layer AD1 may contact the anti-reflection layer ARL and the cover organic layer IJP.

The window 300 may be disposed on the anti-reflection layer ARL. For example, the window 300 may contact the anti-reflection layer ARL. A second adhesive layer AD2 may be disposed between the anti-reflection layer ARL and the window 300 to couple the anti-reflection layer ARL to the window 300. For example, the second adhesive layer AD2 may contact the anti-reflection layer ARL and the window 300. The second adhesive layer AD2 may include the same material as the first adhesive layer AD1.

A module hole MH may be defined in the display module 100-*b* according to an embodiment. The module hole MH may correspond to the hole area A1-H of the first area A1.

A circuit element layer, a display element layer, and an encapsulation layer TFE overlapping a hole area A1-H of the first area A1 of the display panel 110 may pass through the module hole MH. The input sensor 120 overlapping the hole area A1-H of the first area A1 may pass through the module hole MH. The cover organic layer IJP overlapping the hole area A1-H may pass through the module hole MH.

The module hole MH according to an embodiment of the inventive concept may expose a portion SUB-E on a top surface of a base layer SUB, which overlaps the hole area A1-H.

According to this embodiment, a filling part RS-b disposed inside the module hole MH may be provided. The filling part RS-b may compensate for a height difference formed as the components of the display panel 110 are removed in the process of forming the module hole MH. The filling part RS-b according to an embodiment may include a polymer resin.

The filling part RS-b according to an embodiment is in contact with side surfaces of the insulating layers, side surfaces of the common electrode CE, side surfaces of the first and second inorganic layers IOL1 and IOL2 of the encapsulation layer TFE, side surfaces of the sensing insulating layers TIL1, TIL2, and TIL3, and side surfaces of the cover organic layer IJP, which define the module hole MH. In addition, the filling portion RS-b may be in contact with side surfaces of the first adhesive layer AD1 defining the first opening AD1-OP and side surfaces of the anti-reflection layer ARL defining the hole opening ARL-OP and may be in contact with a portion SUB-E of the base layer SUB and a portion AD2-E of the second adhesive layer AD2.

Figure 7:
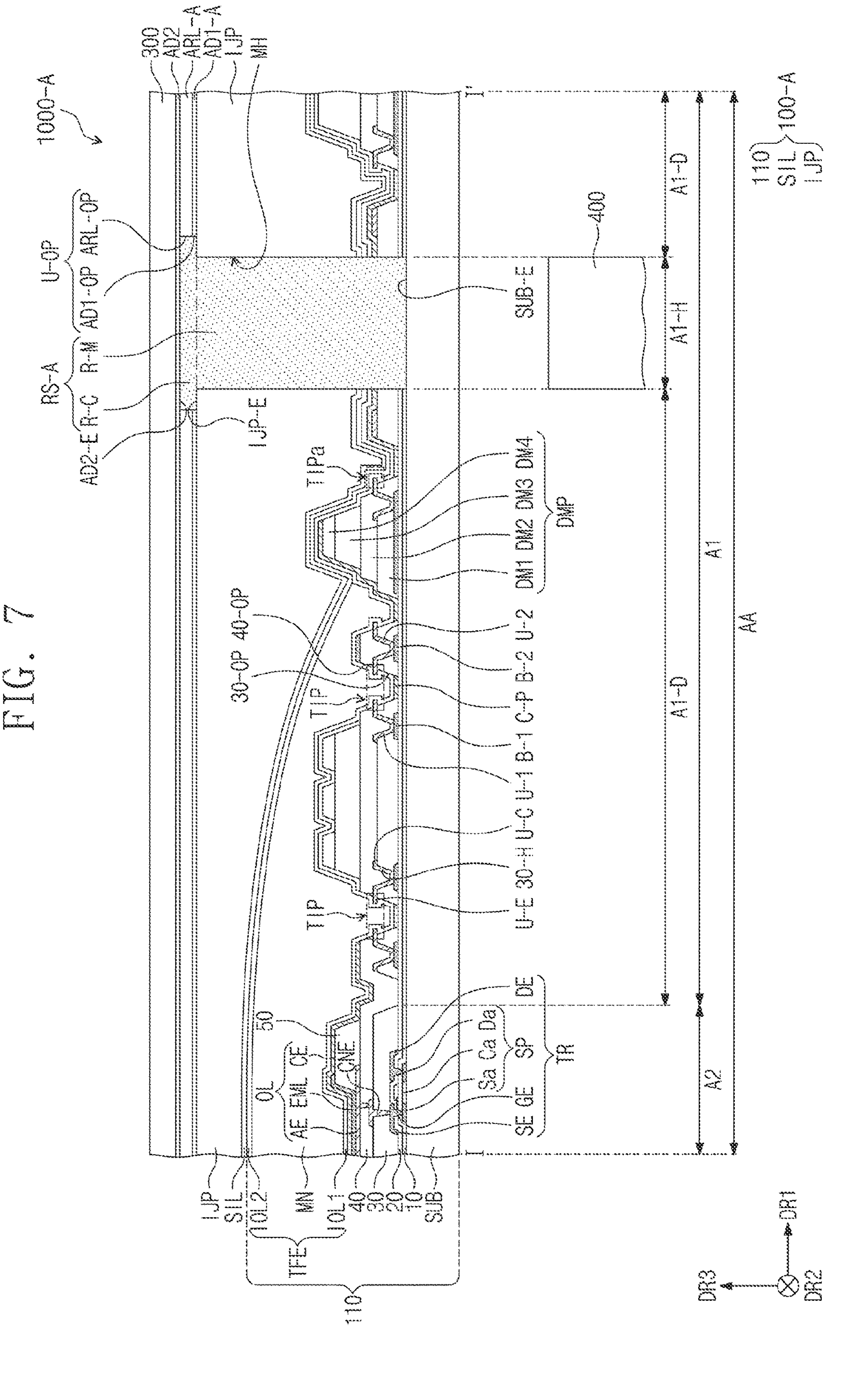
FIG. 7 is a cross-sectional view of an electronic device according to an embodiment of the inventive concept.
Figure 8A:
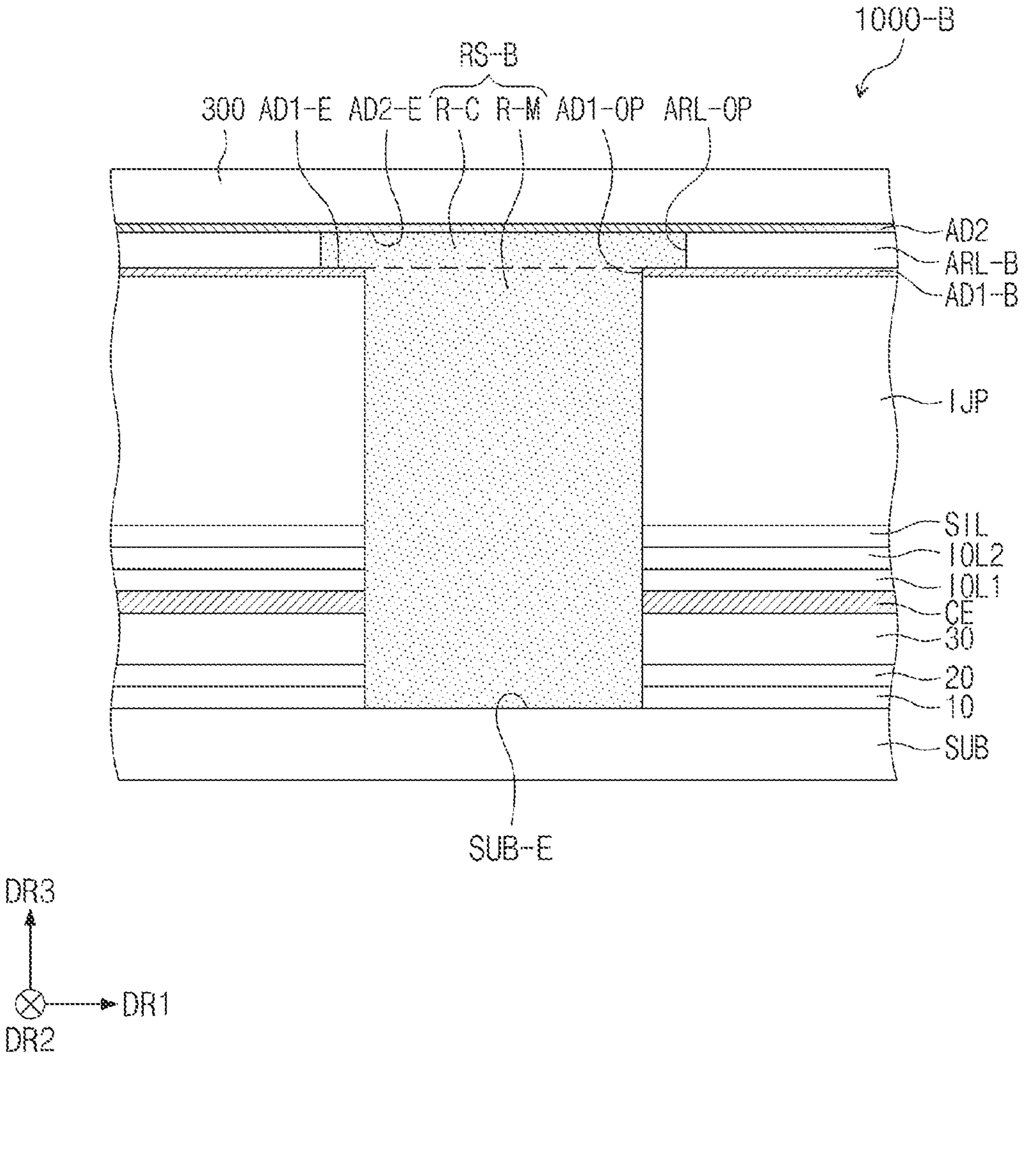
FIG. 8A is an enlarged view illustrating a portion of the electronic device according to an embodiment of the inventive concept.
Figure 8B:
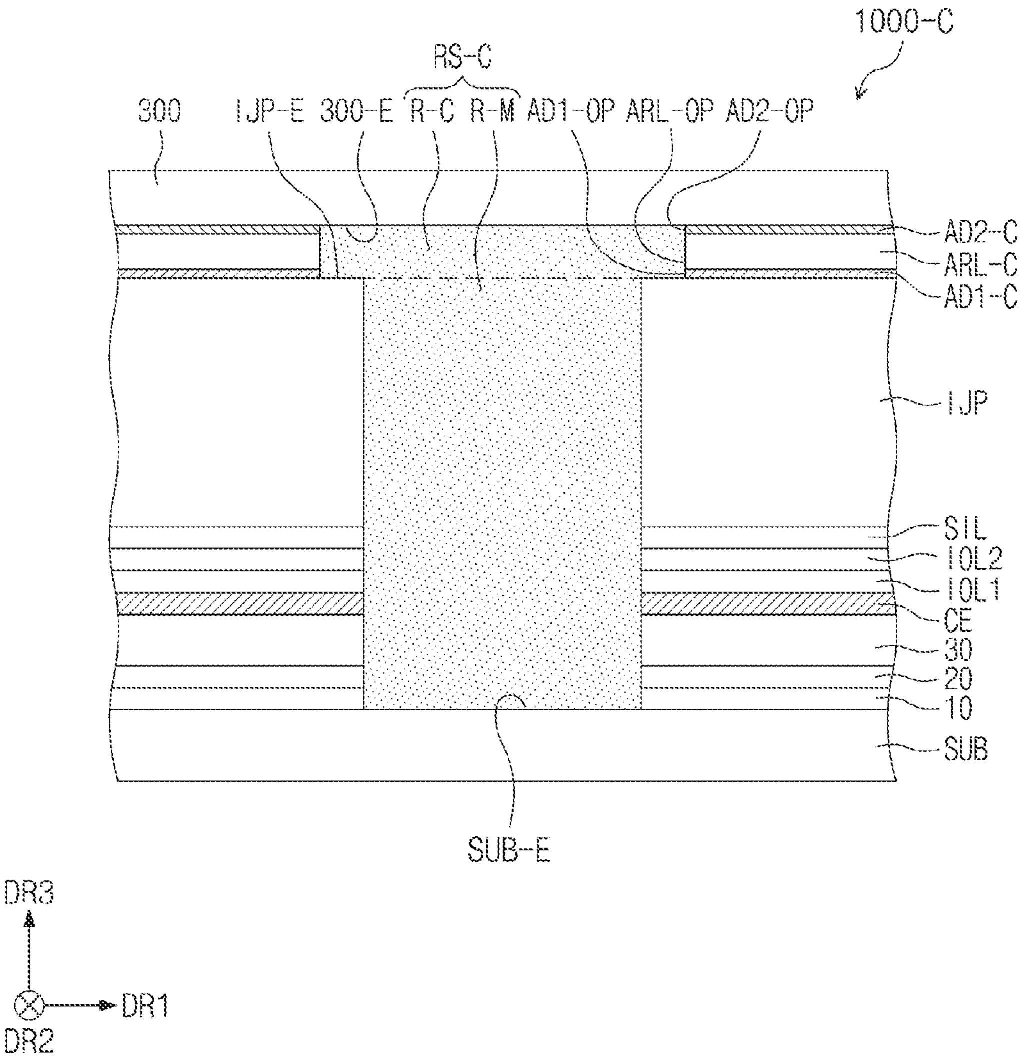
FIG. 8B is an enlarged view illustrating a portion of the electronic device according to an embodiment of the inventive concept.

FIG. 7 is a cross-sectional view of an electronic device according to an embodiment of the inventive concept. FIG. 6 is a cross-sectional view corresponding to FIG. 5. FIG. 8A is an enlarged view illustrating a portion of the electronic device according to an embodiment of the inventive concept. FIG. 8B is an enlarged view illustrating a portion of the electronic device according to an embodiment of the inventive concept. The same/similar reference numerals are used for the same components as those of FIG. 5, and thus, their duplicated descriptions will be omitted.

Referring to FIG. 7, an electronic device 1000-A according to an embodiment may include a display module 100-A, an anti-reflection layer ARL-A, a window 300, an electronic module 400, and adhesive layers AD1-A and AD2. The display module 100-A may include a display panel 110, a cover inorganic layer SIL, and a cover organic layer IJP. Descriptions of the display panel 110, the cover organic layer IJP, the cover organic layer IJP, and the window 300 may correspond to those described with reference to FIG. 5.

A module hole MH may be defined in the display module 100-A according to an embodiment. The module hole MH may correspond to the hole area A1-H of the first area A1.

The circuit element layer, the display element layer, and the encapsulation layer TFE overlapping the hole area A1-H of the first area A1 of the display panel 110 may pass through the module hole MH. The cover inorganic layer SIL and the cover organic layer IJP overlapping the hole area A1-H of the first area A1 may be formed to pass through the module hole MH. The module hole MH according to an embodiment may expose a portion SUB-E on a top surface of the base layer SUB, which overlaps the hole area A1-H.

According to this embodiment, the display module 100-A may include a filling part RS-a disposed inside the module hole MH. The filling part RS-A may compensate for a height difference formed as the components of the display panel 110 are removed in the process of forming the module hole MH. The filling part RS-A according to an embodiment may include a polymer resin.

The first adhesive layer AD1-A according to an embodiment may include a first opening AD1-OP corresponding to the module hole MH. The anti-reflection layer ARL-A may include a hole opening ARL-OP corresponding to the first opening AD1-OP. The first opening AD1-OP and the hole opening ARL-OP may expose a portion AD2-E of a rear surface of the second adhesive layer AD2, which overlaps the hole area A1-H.

In an embodiment, a width of each of the first opening AD1-OP and the hole opening ARL-OP in the first direction DR1 is greater than a width of the module hole MH. Thus, a portion IJP-E of the cover organic layer IJP may be exposed from the first adhesive layer AD1-A and the anti-reflection layer ARL-A by the first opening AD1-OP and the hole opening ARL-OP.

The filling part RS-A according to an embodiment includes a first portion R-M and a second portion R-C. In an embodiment, in the first direction DR1, a width of the first portion R-M is less than a width of the second portion R-C. The first portion R-M and the second portion R-C are divided for configurations or convenience of description.

The first portion R-M may be disposed inside the module hole MH. Thus, the first portion R-M may be in contact with side surfaces of the insulating layers, side surfaces of the common electrode CE, side surfaces of the first and second inorganic layers IOL1 and IOL2 of the encapsulation layer TFE, side surfaces of the cover inorganic layer SIL, and side surfaces of the cover organic layer IJP, which define the module hole MH. In addition, the first portion R-M may be in contact with the portion SUB-E of the base layer SUB.

The second portion R-C may be disposed inside the first opening AD1-OP and the hole opening ARL-OP. Thus, the second portion R-C may be in contact with the side surface of the first adhesive layer AD1-A and the side surface of the anti-reflection layer ARL-A, which define the first opening AD1-OP. In addition, the second portion R-C may be in contact with the portion AD2-E of the second adhesive layer AD2. According to this embodiment, the second portion R-C may be in contact with the portion IJP-E of the cover organic layer IJP.

FIGS. 8A and 8B are enlarged views of an area on which filling parts RS-B and RS-C are disposed in the cross-sectional view of FIG. 7.

Referring to FIG. 8A, an electronic device 1000-B according to an embodiment may include a filling part RS-B disposed inside a module hole MH, a first adhesive layer AD1-B disposed between a cover organic layer IJP and an anti-reflection layer ARL to couple the cover organic layer IJP to the anti-reflection layer ARL, and a second adhesive layer AD2 disposed between the cover organic layer IJP and a window 300 to couple the anti-reflection layer ARL to the window 300.

The first adhesive layer AD1-B according to an embodiment may include a first opening AD1-OP corresponding to the module hole MH. The anti-reflection layer ARL-B may include a hole opening ARL-OP corresponding to the first opening AD1-OP. The hole opening ARL-OP may expose a portion AD2-E of a rear surface of the second adhesive layer AD2, which overlaps the hole area A1-H (see FIG. 7).

According to an embodiment, a width of the first opening AD1-OP in the first direction DR1 is less than a width of the hole opening ARL-OP and equal to that of the module hole MH. Thus, a portion AD1-E of the first adhesive layer AD1-B may be exposed from the anti-reflection layer ARL-B through the hole opening ARL-OP.

The filling part RS-B according to an embodiment includes a first portion R-M and a second portion R-C. In an embodiment, in the first direction DR1, a width of the first portion R-M is less than a width of the second portion R-C. The first portion R-M and the second portion R-C are divided for configurations or convenience of description.

The first portion R-M may be disposed inside the module hole MH. Thus, the first portion R-M may be in contact with side surfaces of the insulating layers 10, 20, and 30, side surface of the common electrode CE, side surfaces of the first and second inorganic layers IOL1 and IOL2, side surfaces of the cover inorganic layer SIL, and side surfaces of the cover organic layer IJP, which define the module hole MH. In addition, the first portion R-M may be in contact with the portion SUB-E of the base layer SUB.

The second portion R-C may be disposed inside the first opening AD1-OP and the hole opening ARL-OP. Thus, the second portion R-C may be in contact with the side surface of the first adhesive layer AD1-B and the side surface of the anti-reflection layer ARL-B, which define the first opening AD1-OP. In addition, the second portion R-C may be in contact with the portion AD2-E of the second adhesive layer AD2.

Referring to FIG. 8B, an electronic device 1000-C according to an embodiment may include a filling part RS-C disposed inside a module hole MH, a first adhesive layer AD1-C disposed between a cover organic layer IJP and an anti-reflection layer ARL to couple the cover organic layer IJP to the anti-reflection layer ARL, and a second adhesive layer AD2-C disposed between the cover organic layer IJP and a window 300 to couple the anti-reflection layer ARL to the window 300.

The first adhesive layer AD1-C according to an embodiment may include a first opening AD1-OP corresponding to the module hole MH. The anti-reflection layer ARL-C may include a hole opening ARL-OP corresponding to the first opening AD1-OP. The second adhesive layer AD2-C according to an embodiment may include a second opening AD2-OP corresponding to the hole opening ARL-OP. The second opening AD2-OP may expose a portion 300-E of a rear surface of the window 300, which overlaps the hole area A1-H (see FIG. 7).

According to an embodiment, a width of the first opening AD1-OP, a width of the hole opening ARL-OP, and a width of the second opening AD2-OP are the same in the first direction DR1. Thus, a portion IJP-E of the cover organic layer IJP may be exposed from the first adhesive layer AD1-C, the anti-reflection layer ARL-C, and the second adhesive layer AD2-C by the hole opening ARL-OP and the second opening AD2-OP.

The filling part RS-C according to an embodiment includes a first portion R-M and a second portion R-C. In an embodiment, in the first direction DR1, a width of the first portion R-M is less than a width of the second portion R-C. The first portion R-M and the second portion R-C are divided for configurations or convenience of description.

The first portion R-M may be disposed inside the module hole MH. Thus, the first portion R-M may be in contact with side surfaces of the insulating layers 10, 20, and 30, a side surface of the common electrode CE, side surfaces of the first and second inorganic layers IOL1 and IOL2, side surfaces of the cover inorganic layer SIL, and side surfaces of the cover organic layer IJP, which define the module hole MH. In addition, the first portion R-M may be in contact with the portion SUB-E of the base layer SUB.

The second portion R-C may be disposed inside the first opening AD1-OP, the hole opening ARL-OP, and the second opening AD2-OP. Thus, the second portion R-C may be in contact with a side surface of the first adhesive layer AD1-C, which defines the first opening AD1-OP, a side surface of the anti-reflection layer ARL-C, and side surfaces of the second adhesive layer AD2-C, which defines the second opening AD2-OP. In addition, the second portion R-C may be in contact with the portion IJP-E of the cover organic layer IJP. According to this embodiment, the second portion R-C may be in contact with the portion 300-E of the window 300.

FIGS. 9A to 9F are cross-sectional views illustrating a method for manufacturing an electronic device according to an embodiment of the inventive concept. The same/similar reference numerals are used for the same/similar configurations as the configurations described in FIGS. 1 to 7, and redundant descriptions are omitted.

Figure 9A:
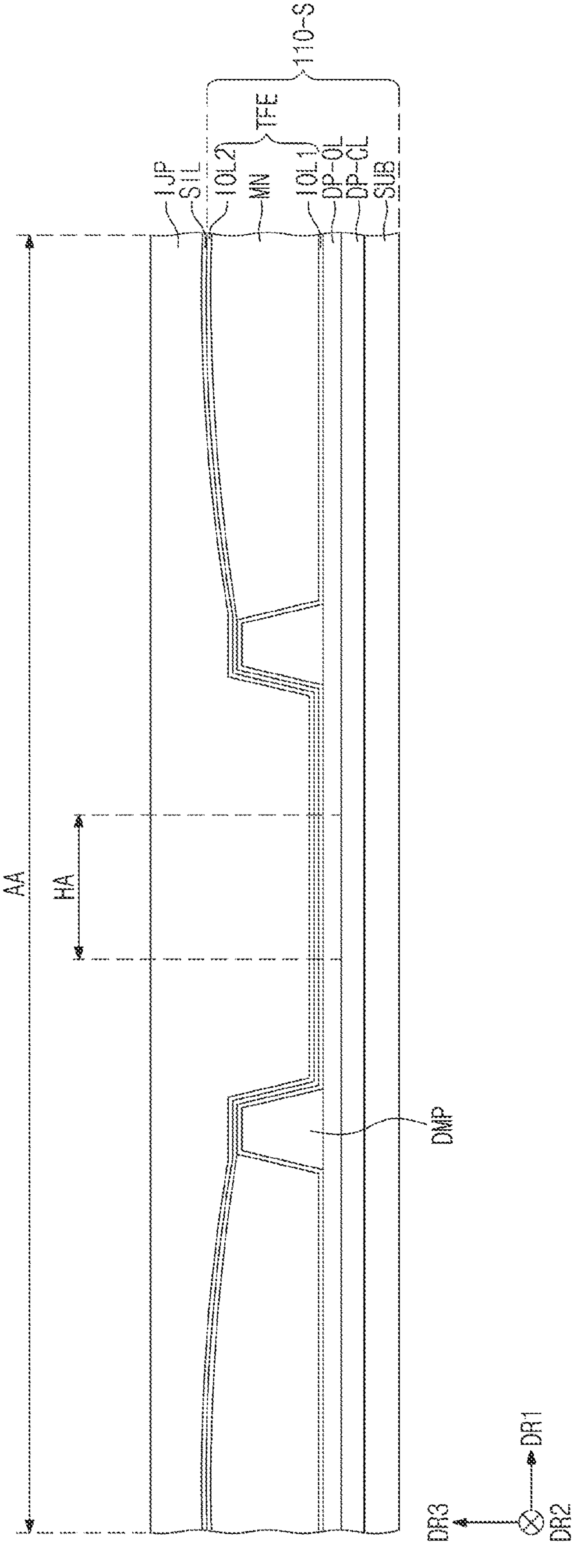
FIG. 9A is a cross-sectional view illustrating a method for manufacturing an electronic device according to an embodiment of the inventive concept.

Referring to FIG. 9A, a method of manufacturing an electronic device according to an embodiment includes forming a preliminary display panel 110-S.

The preliminary display panel 110-S may be defined as a state before a module hole MH is formed in a display panel 110 described in FIG. 5. The preliminary display panel 110-S may include a base layer SUB including an active area AA on which a hole processing area HA is defined, a circuit element layer DP-CL formed on the base layer SUB, a display element layer DP-OL formed on the circuit element layer DP-CL, an encapsulation layer TFE formed on the display element layer DP-OL, a cover inorganic layer SIL formed on the encapsulation layer TFE, and a cover organic layer IJP formed on the cover inorganic layer SIL.

The cover organic layer IJP may be formed by discharging an organic material onto the cover inorganic layer SIL through an inkjet process. The circuit element layer DP-CL, the display element layer DP-OL, the encapsulation layer TFE, the cover inorganic layer SIL, and the cover organic layer IJP may correspond to the circuit element layer, the display element layer, the encapsulation layer TFE, the cover inorganic layer SIL, and the cover organic layer IJP, respectively, which have been described with reference to FIG. 5. The circuit element layer DP-CL and the display element layer DP-OL illustrated in FIGS. 9A to 9E are briefly illustrated by omitting components provided in the circuit element layer and the display element layer of FIG. 5.

Figure 9B:
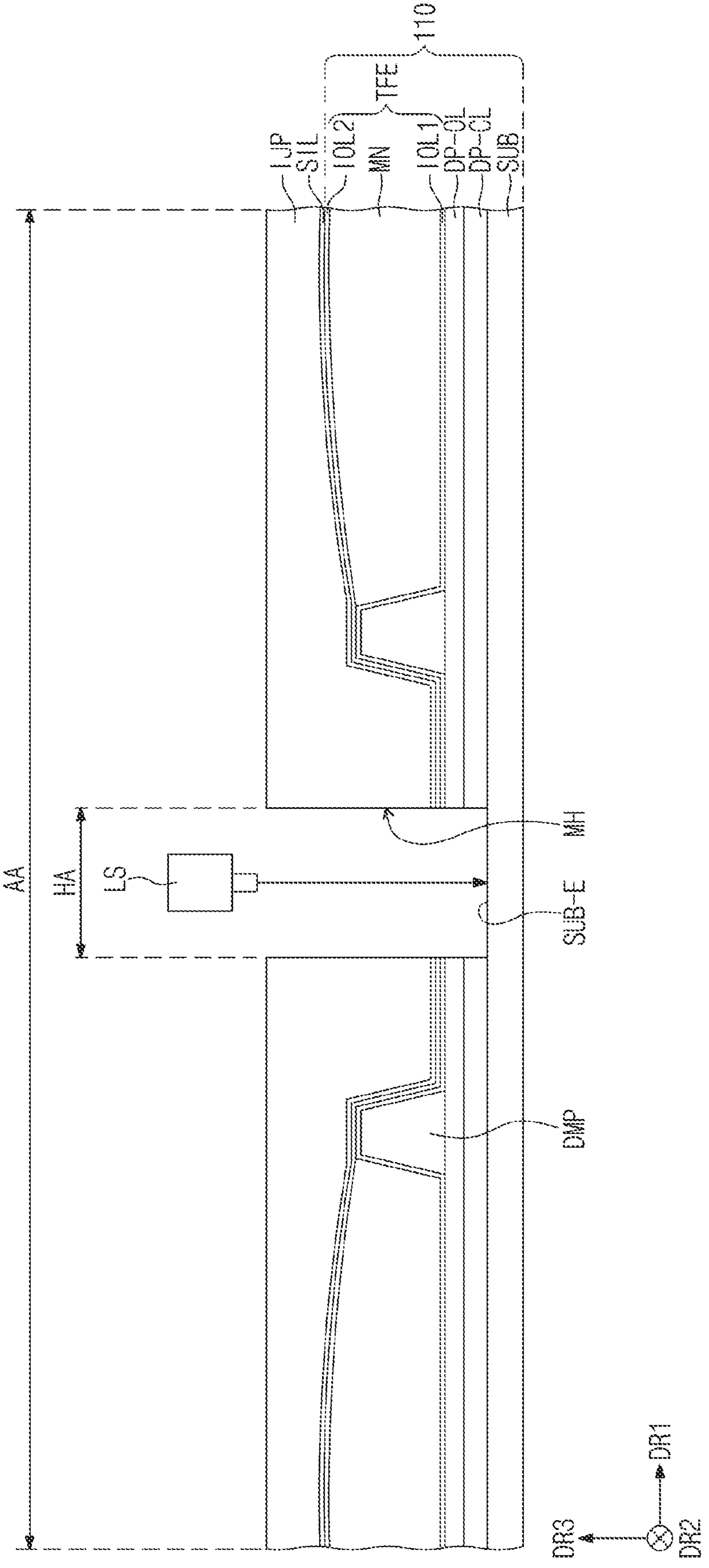
FIG. 9B is a cross-sectional view illustrating a method for manufacturing an electronic device according to an embodiment of the inventive concept.

Referring to FIG. 9B, the method of manufacturing the electronic device according to an embodiment includes forming a module hole MH. The module hole MH may be formed by a laser LS applying a laser beam to the hole processing area HA of the preliminary display panel 110-S. Here, the circuit element layer DP-CL, the display element layer DP-OL, the encapsulation layer TFE, and the cover inorganic layer SIL, and the cover organic layer IJP, which overlap the hole processing area HA of the preliminary display panel 110-S may be removed due to the laser beam.

According to an embodiment, in the forming of the module hole MH, a portion SUB-E of a top surface of the base layer SUB, which overlaps the hole processing area HA, may be exposed by a laser process that applies the laser beam.

Figure 9C:
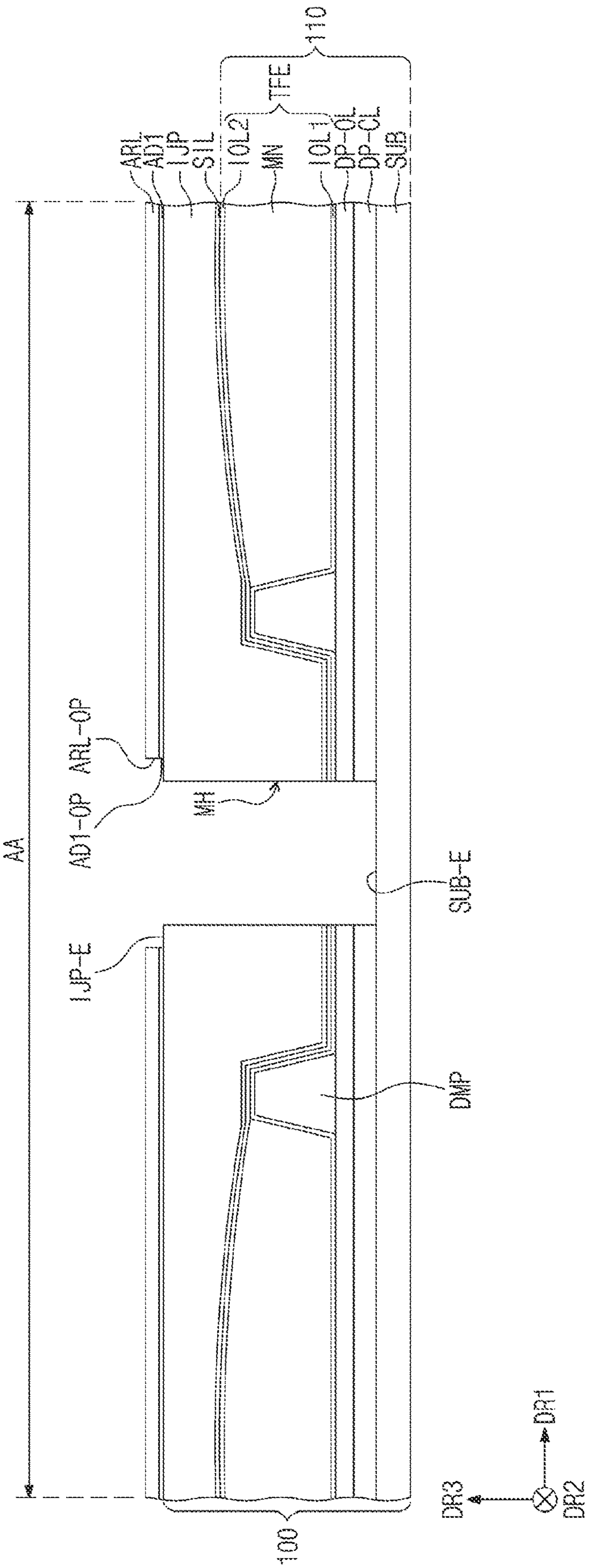
FIG. 9C is a cross-sectional view illustrating a method for manufacturing an electronic device according to an embodiment of the inventive concept.

Then, referring to FIG. 9C, the method of manufacturing the electronic device according to an embodiment includes disposing a first adhesive layer AD1 on the cover organic layer IJP. A first opening AD1-OP corresponding to the module hole MH may be formed in the first adhesive layer AD1. For example, a portion of the first adhesive layer AD1 may be removed to the form the first opening AD1-OP.

The method of manufacturing the electronic device according to an embodiment includes disposing an on the first adhesive layer AD1. A hole opening ARL-OP corresponding to the first opening AD1-OP may be formed in the anti-reflection layer ARL. For example, a portion of the anti-reflection layer ARL may be removed to form the hole opening ARL-OP.

Figure 9D:
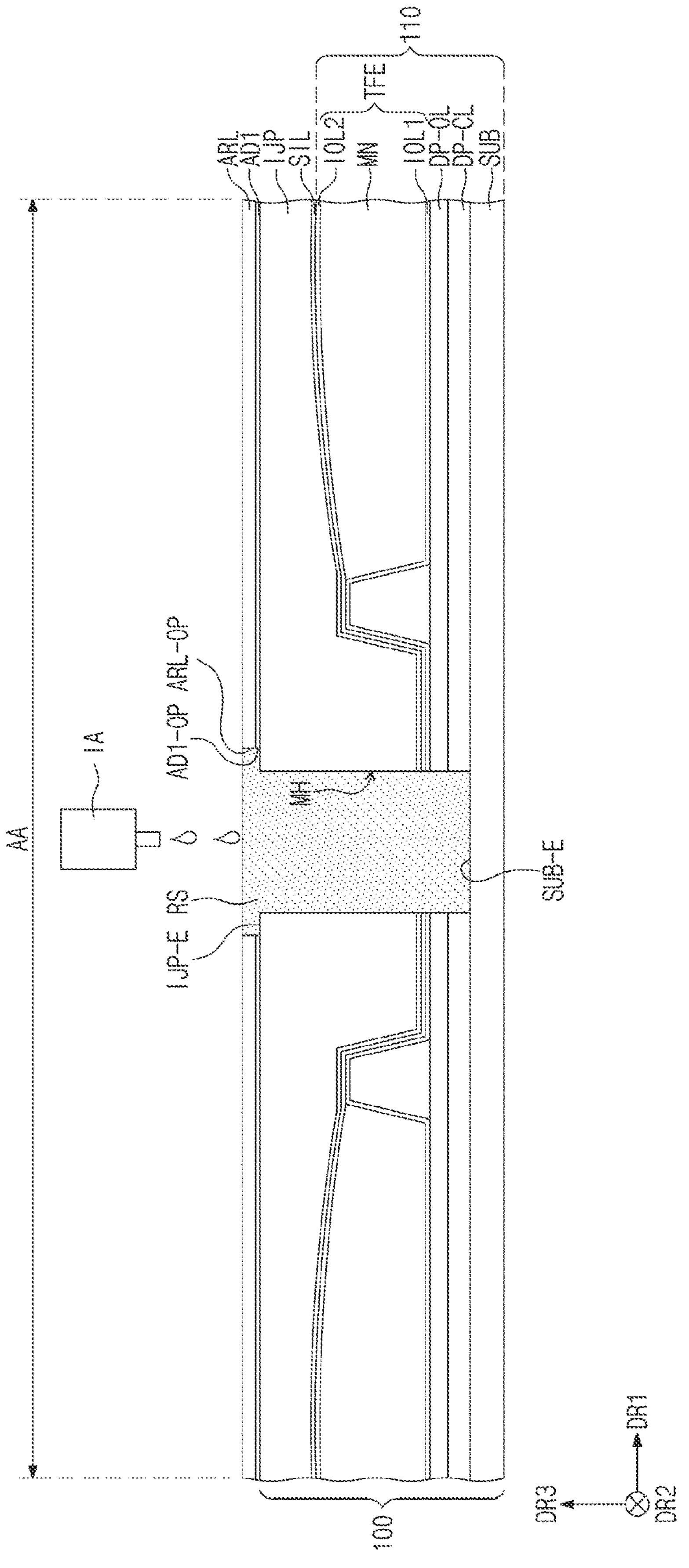
FIG. 9D is a cross-sectional view illustrating a method for manufacturing an electronic device according to an embodiment of the inventive concept.

Then, referring to FIG. 9D, the method of manufacturing an electronic device according to an embodiment includes forming a filling part RS in the module hole MH. The filling part RS may be formed not only in the module hole MH but also inside the first opening AD1-OP and the hole opening ARL-OP.

Equipment IA containing a polymer resin may apply the polymer resin to a portion SUB-E of the base layer SUB to fill the module hole MH to form the filling part RS. For example, the polymer resin may include at least one of silicone, acrylic resin, urethane resin, or epoxy.

Figure 9E:
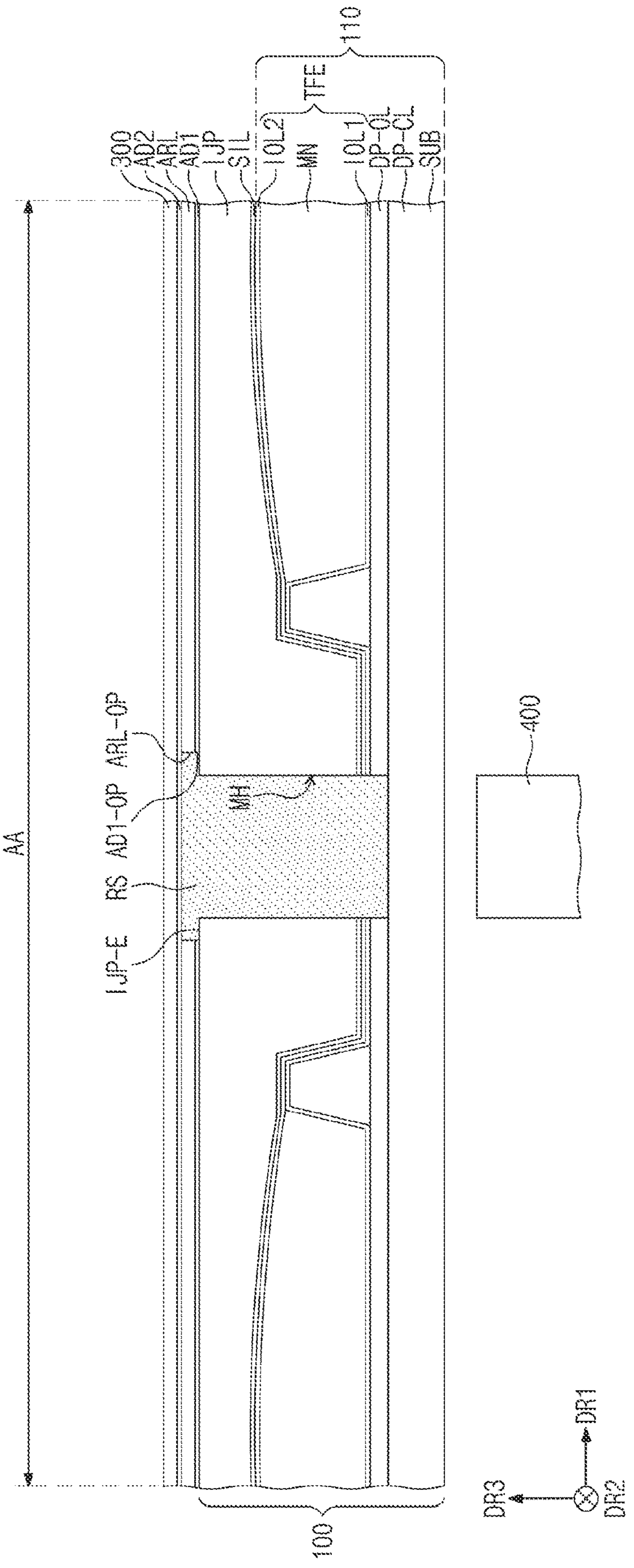
FIG. 9E is a cross-sectional view illustrating a method for manufacturing an electronic device according to an embodiment of the inventive concept.

Then, referring to FIG. 9E, the method of manufacturing the electronic device according to an embodiment includes disposing a second adhesive layer AD2 on the anti-reflection layer ARL and forming a window 300 on the second adhesive layer AD2. The filling part RS may be in contact with a portion of a rear surface of the second adhesive layer AD2 corresponding to the module hole MH.

Thereafter, the method may include disposing an electronic module 400 below the base layer SUB overlapping the module hole MH. For example, the electronic module 400 may include a camera module.

According to the embodiment of the inventive concept, since the filling part is disposed inside the module hole, the anti-reflection layer may be evenly disposed on the display panel. Therefore, deformation of the shape such as the inclination of the anti-reflection layer at the portion adjacent to the module hole may be prevented from occurring, and also, and waviness due to interference with reflected light introduced into the module hole through the window may be prevented from occurring.

It will be apparent to those skilled in the art that various modifications and deviations can be made in the inventive concept. Thus, it is intended that the inventive concept covers the modifications and deviations of this invention provided they come within the scope of the appended claims and their equivalents.

Accordingly, the technical scope of the inventive concept should not be limited to the contents described in the detailed description of the specification.

What is claimed is:

1. An electronic device comprising:
a window;
a display device disposed below the window and comprising:
a base layer comprising a first area and a second area having a light transmittance less than a light transmittance of the first area and surrounding a portion of the first area;
a circuit element layer comprising insulating layers and a transistor and disposed on an upper surface of the base layer;
a display element layer comprising a light emitting element connected to the transistor and disposed on the circuit element layer;
an encapsulation layer covering the display element layer;
a cover inorganic layer disposed on the encapsulation layer;
a cover organic layer disposed on the cover inorganic layer;
an anti-reflection layer disposed on the cover organic layer and comprising a hole opening overlapping the first area; and
a filling part overlapping the first area;
an adhesive layer disposed between the window and the anti-reflection layer; and
a sensor disposed below the base layer and overlapping the first area,
wherein a module hole is defined in the display device, the module hole extending through the circuit element layer, the display element layer, the encapsulation layer, the cover inorganic layer, and the cover organic layer overlapping the first area to expose a portion of the upper surface of the base layer, and
wherein the filling part is disposed inside the module hole and the filling part is in contact with the portion of the upper surface of the base layer exposed by the module hole and a portion of a bottom surface of the adhesive layer overlapping the module hole, and the filling part is spaced apart from the window.

2. The electronic device of claim 1, further comprising & an additional adhesive layer disposed between the cover organic layer and the anti-reflection layer and comprising a first opening corresponding to the hole opening,
wherein the filling part is in contact with a side surface of the anti-reflection layer defining the hole opening, and a side surface of the additional adhesive layer defining the first opening.

3. The electronic device of claim 2, wherein a width of the hole opening in one direction is greater than a width of the first opening in the one direction, and
wherein a top surface of the additional adhesive layer exposed from the anti-reflection layer by the hole opening is in contact with the filling part.

4. The electronic device of claim 2, wherein a width of each of the hole opening and the first opening in one direction is greater than a width of the module hole in the one direction, and wherein a top surface of the cover organic layer exposed from the anti-reflection layer and the additional adhesive layer by the hole opening and the first opening is in contact with the filling part.

5. The electronic device of claim 1, wherein the filling part comprises a polymer resin.

6. The electronic device of claim 1, wherein the first area comprises a hole area corresponding to the module hole and a blocking area surrounding the hole area and adjacent to the second area, and wherein the circuit element layer comprises a dam part overlapping the blocking area, comprises a same material as at least one of the insulating layers, and surrounds the hole area.

7. The electronic device of claim 6, wherein a lower insulating layer and an upper insulating layer contacting the lower insulating layer, among the insulating layers inside the blocking area comprise a tip opening, and the circuit element layer further comprises a protruding pattern having a first side protruding between a side surface of the lower insulating layer and a side surface of the upper insulating layer, which define the tip opening, and a second other side disposed between the lower insulating layer and the upper insulating layer.

8. The electronic device of claim 7, further comprising a lower pattern connected to the protruding pattern through a contact hole defined in the lower insulating layer and disposed between the lower insulating layer and the base layer.

9. The electronic device of claim 8, wherein at least one of the protruding pattern and the lower pattern is disposed on a same layer as one of a plurality of electrodes in the transistor.

10. The electronic device of claim 7, wherein the encapsulation layer comprises:

a first inorganic layer in contact with the display element layer;

a second inorganic layer disposed on the first inorganic layer; and an organic layer disposed between the first inorganic layer and the second inorganic layer, wherein the first inorganic layer is in contact with the side surface of the lower insulating layer, the side surface of the upper insulating layer, and the first side of the protruding pattern, which define the tip opening.

11. The electronic device of claim 7, wherein the light emitting element comprises a first electrode connected to the transistor, a second electrode disposed on the first electrode, and an emission layer disposed between the first electrode and the second electrode, and wherein the circuit element layer further comprises a tip pattern disposed inside the tip opening, wherein the tip pattern comprises a same material as the second electrode.

12. The electronic device of claim 1, wherein the sensor comprises a camera.

13. The electronic device of claim 1, wherein the base layer comprises glass.

14. A method for manufacturing an electronic device, the method comprising:

forming a preliminary display panel comprising a base layer comprising an active area, on which a hole processing area is defined, and a circuit element layer, a display element layer, an encapsulation layer, a cover inorganic layer, and a cover organic layer, which are sequentially laminated on the base layer;

removing a portion of the circuit element layer, the display element layer, the encapsulation layer, the cover inorganic layer, and the cover organic layer, which overlaps the hole processing area, to form a module hole;

forming a first adhesive layer comprising a first opening corresponding to the module hole on the cover organic layer;

forming an anti-reflection layer comprising a hole opening corresponding to the first opening on the first adhesive layer;

forming a second adhesive layer on the anti-reflection layer;

forming a window on the second adhesive layer; and filling the module hole with a filling part, and wherein the module hole exposes a portion of an upper surface of the base layer overlapping the hole processing area, and wherein the filling part is in contact with the portion of the upper surface of the base layer exposed by the module hole and a portion of a bottom surface of the adhesive layer overlapping the module hole, and the filling part is spaced apart from the window.

15. The method of claim 14, wherein the filling part is in contact with a side surface of the anti-reflection layer defining the hole opening, and a side surface of the first adhesive layer defining the first opening.

16. The method of claim 15, wherein a width of each of the hole opening and the first opening in one direction is greater than that of the module hole in the one direction, and a top surface of the cover organic layer exposed from the anti-reflection layer and the first adhesive layer by the hole opening and the first opening is in contact with the filling part.

17. The method of claim 14, wherein the forming of the module hole comprises removing the portion of the circuit element layer, the display element layer, the encapsulation layer, the cover inorganic layer, and the cover organic layer, which overlap the hole processing area, by applying a laser beam to the portion.

18. The method of claim 14, further comprising forming an electronic device below the base layer overlapping the module hole.

19. The method of claim 14, wherein the filling part comprises a polymer resin.

* * * * *